US012603143B2

(12) United States Patent
Cha et al.

(10) Patent No.: US 12,603,143 B2
(45) Date of Patent: Apr. 14, 2026

(54) MEMORY CONTROLLER FOR CONTROLLING BACKGROUND OPERATION AND OPERATION METHOD THEREOF

(71) Applicant: SAMSUNG ELECTRONICS CO., LTD., Suwon-si (KR)

(72) Inventors: Sangsoo Cha, Suwon-si (KR); Minjeong Kwon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 48 days.

(21) Appl. No.: 18/645,810

(22) Filed: Apr. 25, 2024

(65) Prior Publication Data

US 2025/0037779 A1 Jan. 30, 2025

(30) Foreign Application Priority Data

Jul. 28, 2023 (KR) ........................ 10-2023-0098998

(51) Int. Cl.
G11C 29/12 (2006.01)
G06F 3/06 (2006.01)
(Continued)

(52) U.S. Cl.
CPC ........ G11C 29/1201 (2013.01); G06F 3/0604 (2013.01); G06F 3/061 (2013.01);
(Continued)

(58) Field of Classification Search
CPC . G11C 29/1201; G11C 16/3495; G11C 29/52; G11C 2029/0409;
(Continued)

(56) References Cited

U.S. PATENT DOCUMENTS 7,984,084 B2 7/2011 Sinclair
9,619,381 B2 * 4/2017 Camp ................. G06F 12/0246
(Continued)

FOREIGN PATENT DOCUMENTS

EP 4099329 12/2022

OTHER PUBLICATIONS

Papandreou et al., Reliability of 3D NAND flash memory with a focus on read voltage calibration from a system aspect, Oct. 1, 2019, IEEE, pp. 1-4. (Year: 2019).*

(Continued)

*Primary Examiner* — John J Tabone, Jr.
(74) *Attorney, Agent, or Firm* — Fish & Richardson P.C.

(57) ABSTRACT

A memory controller includes a health grade determining circuit to determine a health grade of a memory block based on a combination of an error detecting result of data read from at least one page of the block and block information related to a degree of degradation of the block, and an IO ratio setting circuit. The IO ratio setting circuit sets, according to the determined health grade, an IO ratio between a host IO operation and an internal IO operation. The host IO operation exchanges data with the memory device in response to a request from a host and the internal IO operation exchanges data with the memory device in relation to a background operation. The memory controller performs the host IO operation and the internal IO operation with the memory device according to the set IO ratio during a period in which the background operation is performed.

20 Claims, 18 Drawing Sheets

(51) Int. Cl.
  *G06F 12/02* (2006.01)
  *G11C 16/34* (2006.01)
  *G11C 29/04* (2006.01)
  *G11C 29/52* (2006.01)
(52) U.S. Cl.
  CPC ........... *G06F 3/0614* (2013.01); *G06F 3/064* (2013.01); *G06F 3/0653* (2013.01); *G06F 3/0658* (2013.01); *G06F 3/0679* (2013.01); *G06F 12/0246* (2013.01); *G11C 16/3495* (2013.01); *G11C 29/52* (2013.01); *G06F 2212/1016* (2013.01); *G06F 2212/1024* (2013.01); *G06F 2212/1032* (2013.01); *G06F 2212/7204* (2013.01); *G06F 2212/7205* (2013.01); *G06F 2212/7208* (2013.01); *G11C 2029/0409* (2013.01); *G11C 2029/0411* (2013.01)
(58) Field of Classification Search
  CPC .......... G11C 2029/0411; G06F 3/0604; G06F 3/061; G06F 3/0614; G06F 3/064; G06F 3/0653; G06F 3/0658; G06F 3/0679; G06F 12/0246; G06F 2212/1016; G06F 2212/1024; G06F 2212/1032; G06F 2212/7204; G06F 2212/7205; G06F 2212/7208
  USPC ........... 714/718, 719; 365/200, 201, 185.09; 711/E12.009
  See application file for complete search history.

(56) References Cited

U.S. PATENT DOCUMENTS

| | | | | |
|---|---|---|---|---|
| 9,921,908 | B2 | 3/2018 | Yum et al. | |
| 9,977,711 | B2 | 5/2018 | Park | |
| 10,445,252 | B2 | 10/2019 | Park et al. | |
| 10,838,627 | B2 | 11/2020 | Kim | |
| 2007/0198786 | A1* | 8/2007 | Bychkov | G11C 29/52 |
| | | | | 711/154 |
| 2015/0178191 | A1* | 6/2015 | Camp | G06F 12/0246 |
| | | | | 711/103 |
| 2015/0234612 | A1* | 8/2015 | Himelstein | G06F 13/00 |
| | | | | 714/6.21 |
| 2016/0357450 | A1* | 12/2016 | Rao | G06F 12/0253 |
| 2018/0157415 | A1 | 6/2018 | Choi et al. | |
| 2018/0165021 | A1* | 6/2018 | Tomic | G06F 3/0655 |
| 2020/0176065 | A1* | 6/2020 | Jung | G11C 16/08 |
| 2021/0004164 | A1* | 1/2021 | Yun | G06F 3/0659 |
| 2021/0357128 | A1 | 11/2021 | Cha | |
| 2022/0253749 | A1 | 8/2022 | Kim et al. | |
| 2022/0415404 | A1 | 12/2022 | Lee et al. | |
| 2023/0139864 | A1 | 5/2023 | Kim et al. | |
| 2024/0319882 | A1* | 9/2024 | Choi | G06F 3/0679 |
| 2025/0037779 | A1* | 1/2025 | Cha | G11C 29/1201 |

OTHER PUBLICATIONS

Extended European Search Report in European Appln. No. 24165186. 8, mailed on Jul. 16, 2024, 14 pages.

* cited by examiner

FIG. 10A

| Error bit | H.Point | Temperature | H.Point | Endurance | H.Point | Block Address | H.Point | Chip RI | H.Point |
|---|---|---|---|---|---|---|---|---|---|
| LESS THAN 60 % | 1 | 60° OR HIGHER | 1 | LESS THAN 30 % | 1 | 0~100 | 1 | A | 1 |
| 60%~70% | 2 | 40°~60° | 2 | 30%~50% | 2 | 100~200 | 2 | B | 2 |
| 70%~80% | 3 | 20°~40° | 3 | 50%~70% | 3 | 200~300 | 3 | C | 3 |
| 80%~90% | 4 | 10°~20° | 4 | 70%~90% | 4 | 300~400 | 4 | D | 4 |
| GREATER THAN 90 % | 5 | 10° OR HIGHER | 5 | GREATER THAN 90 % | 5 | 400 OR GREATER | 5 | E | 5 |

FIG. 10B

|  | H.Point | Host:internal IO RATIO |
|---|---|---|
| H.Grade1 | 20~25 | 90:10 |
| H.Grade2 | 15~20 | 95:5 |
| H.Grade3 | 10~15 | 97:3 |
| H.Grade4 | 5~10 | 99:1 |

Figure 11:
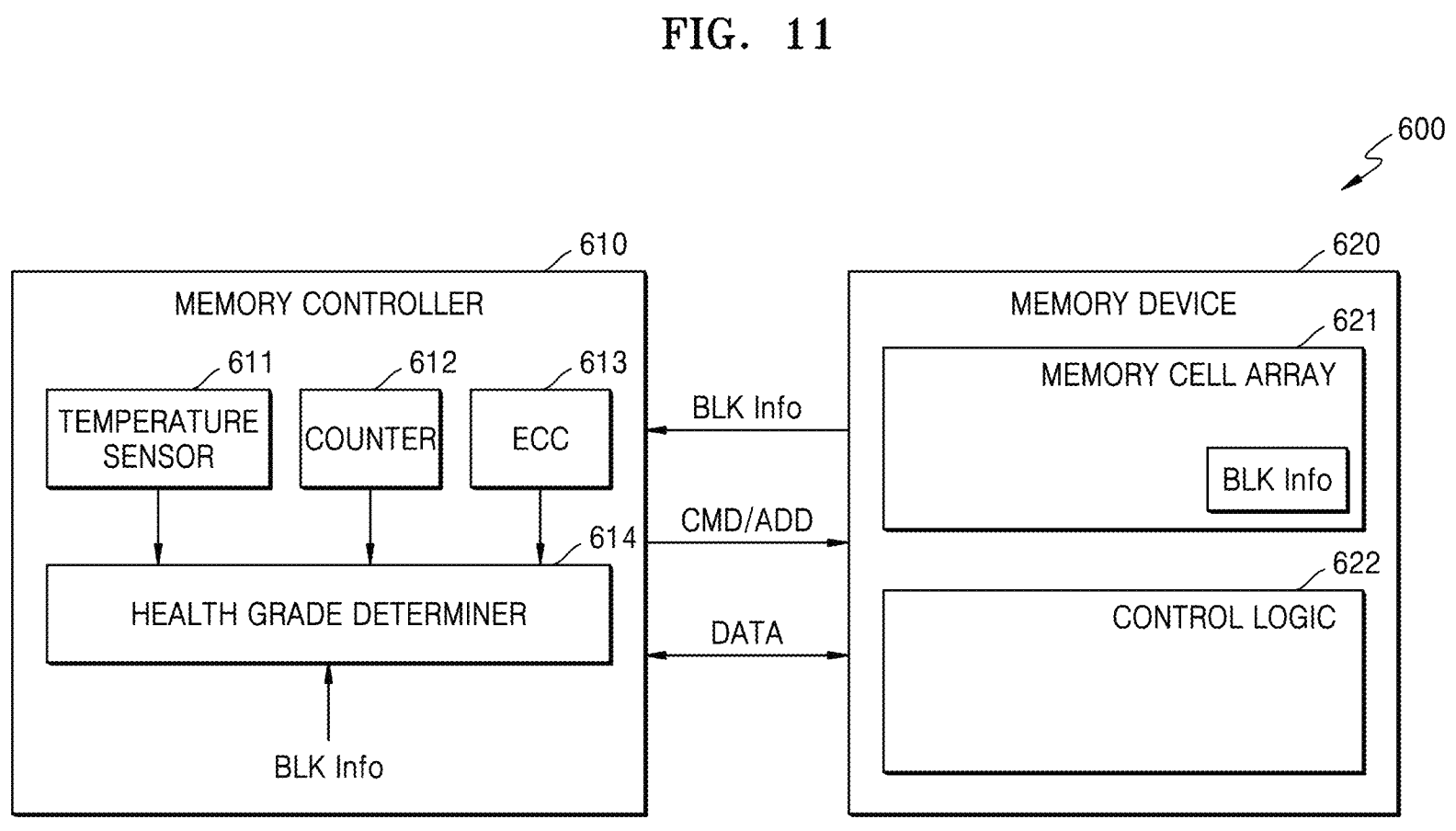

MEMORY DEVICE 620

MEMORY CELL ARRAY 621

BLK Info

CONTROL LOGIC 622

BLK Info

CMD/ADD

DATA

MEMORY CONTROLLER 610

TEMPERATURE SENSOR 611

COUNTER 612

ECC 613

HEALTH GRADE DETERMINER 614

BLK Info

FIG. 14

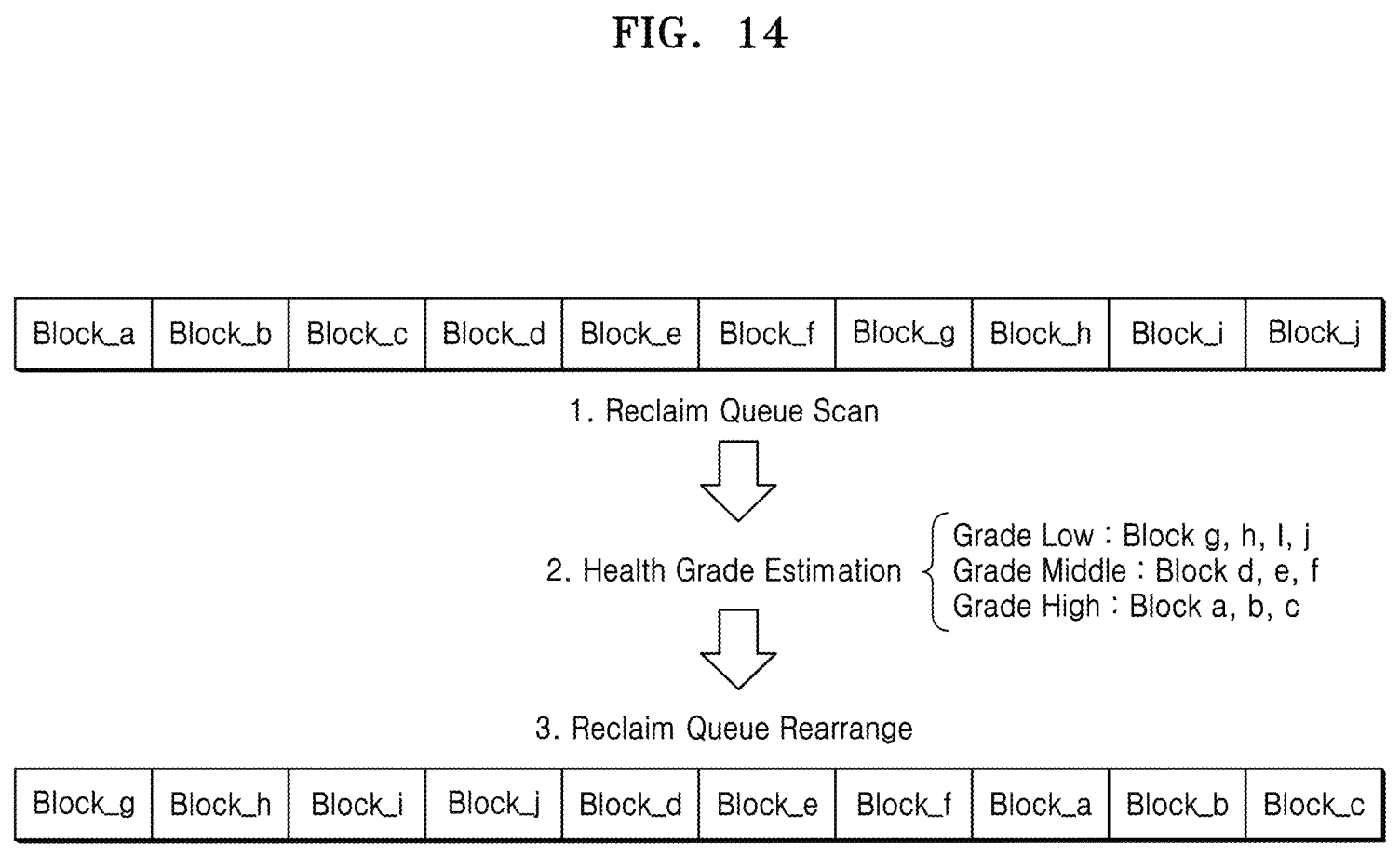

| Block_a | Block_b | Block_c | Block_d | Block_e | Block_f | Block_g | Block_h | Block_i | Block_j |
|---------|---------|---------|---------|---------|---------|---------|---------|---------|---------|

1. Reclaim Queue Scan

2. Health Grade Estimation

Grade Low : Block g, h, I, j
Grade Middle : Block d, e, f
Grade High : Block a, b, c 3. Reclaim Queue Rearrange

| Block_g | Block_h | Block_i | Block_j | Block_d | Block_e | Block_f | Block_a | Block_b | Block_c |
|---------|---------|---------|---------|---------|---------|---------|---------|---------|---------|

DETERMINE ERRORS IN SAMPLE PAGE OF BLOCK — S31

ADD BLOCK TO RECLAIM QUEUE — S32

SCAN ERRORS OF ALL BLOCKS IN RECLAIM QUEUE — S33

CHANGE ORDER OF BLOCKS IN RECLAIM QUEUE — S34

DETERMINE BLOCK INFORMATION OF BLOCK ON WHICH RECLAIM IS TO BE PERFORMED — S35

DETERMINE HEALTH GRADE AND SET IO RATIO — S36

MEMORY CONTROLLER FOR CONTROLLING BACKGROUND OPERATION AND OPERATION METHOD THEREOF

CROSS-REFERENCE TO RELATED APPLICATION

This application is based on and claims priority under 35 U.S.C. § 119 to Korean Patent Application No. 10-2023-098998, filed on Jul. 28, 2023, in the Korean Intellectual Property Office, the disclosure of which is incorporated by reference herein in its entirety.

BACKGROUND

A flash memory device is a nonvolatile memory and may maintain data stored therein even though power thereto is cut off. Recently, storage devices including a flash memory device, such as an embedded multimedia card (eMMC), a universal flash storage (UFS), a solid-state drive (SSD), or a memory card, have been widely used to store or move data.

A flash memory device may perform a background operation, such as reclaim (or read reclaim) or garbage collection. For example, because a flash memory device has the possibility that data stored in some blocks is lost due to degradation over time, a reclaim operation (or a read reclaim operation) of copying data stored in a degraded block to another block may be performed, or a garbage collection operation of generating a new free block by selectively copying valid data stored in blocks to another block may be performed.

However, due to the background operation, an internal input/output operation (IO) (e.g., an internal IO) may be performed between a memory controller and a memory device, and a host IO operation (e.g., a host IO) according to a host's request cannot be performed during the background operation, and thus, the performance of a flash memory device may be degraded such that a response to the host is delayed.

SUMMARY

The subject matter of the present application relates to a memory controller for performing an efficient background operation by setting a ratio between a host input/output (IO) operation and an internal IO operation, an operation method of the memory controller, and a storage device.

In general, according to some aspects, the subject matter of the present disclosure is directed to a memory controller including: a health grade determining circuit configured to determine a health grade of a first block based on a combination of an error detecting result of data read from at least one page of the first block among a plurality of blocks included in a memory device and block information related to determination of a degree of degradation of the first block; and an IO ratio setter circuit configured to set, according to the determined health grade, an IO ratio between a host IO operation that exchanges data with the memory device in response to a request from a host and an internal IO operation that exchanges data with the memory device in relation to a background operation on the memory device, wherein the memory controller performs the host IO operation and the internal IO operation with the memory device according to the set IO ratio during a period in which the background operation on the first block is performed.

In general, according to some aspects, the present disclosure is directed to an operation method of a memory controller, in which the method includes: triggering a background operation on a first block among a plurality of blocks included in a memory device, according to an error detecting result of data read from at least one first page of the first block; setting an IO ratio between a host IO operation that exchanges data with the memory device in response to a request from a host and an internal IO operation that exchanges data with the memory device in relation to a background operation on the memory device, as a first value according to a health grade of the first block, determined based on block information related to determination of a degree of degradation of the first block and an error detecting result of data read from at least one second page of the first block; and performing the host IO operation and the internal IO operation with the memory device according to the IO ratio set as the first value, during a period in which the background operation on the first block is performed.

In general, according to some aspects, the present disclosure is directed to a storage device including: a nonvolatile memory device including a plurality of blocks; and a memory controller configured to perform a host IO operation that exchanges data with the nonvolatile memory device in response to a request from a host and to perform an internal IO operation that exchanges data with the nonvolatile memory device in relation to a background operation on the nonvolatile memory device, wherein the memory controller is further configured to set, as a first value, a performing ratio of the internal IO operation to the host IO operation with respect to a first block among the plurality of blocks based on block information related to determination of a degree of degradation of the first block and set, as a second value, a performing ratio of the internal IO operation to the host IO operation with respect to a second block among the plurality of blocks based on block information related to determination of a degree of degradation of the second block, and when the first value is greater than the second value, a speed of a background operation on the first block is faster than a speed of a background operation on the second block.

BRIEF DESCRIPTION OF THE DRAWINGS

Implementations of the present disclosure will be more clearly understood from the following detailed description taken in conjunction with the accompanying drawings in which:

FIGS. 10A and 10B are tables illustrating a health grade determination example;

FIG. 11 is a block diagram illustrating an example of a memory system;

FIG. 14 illustrates a reclaim operation according to some implementations;

DETAILED DESCRIPTION

Figure 1:
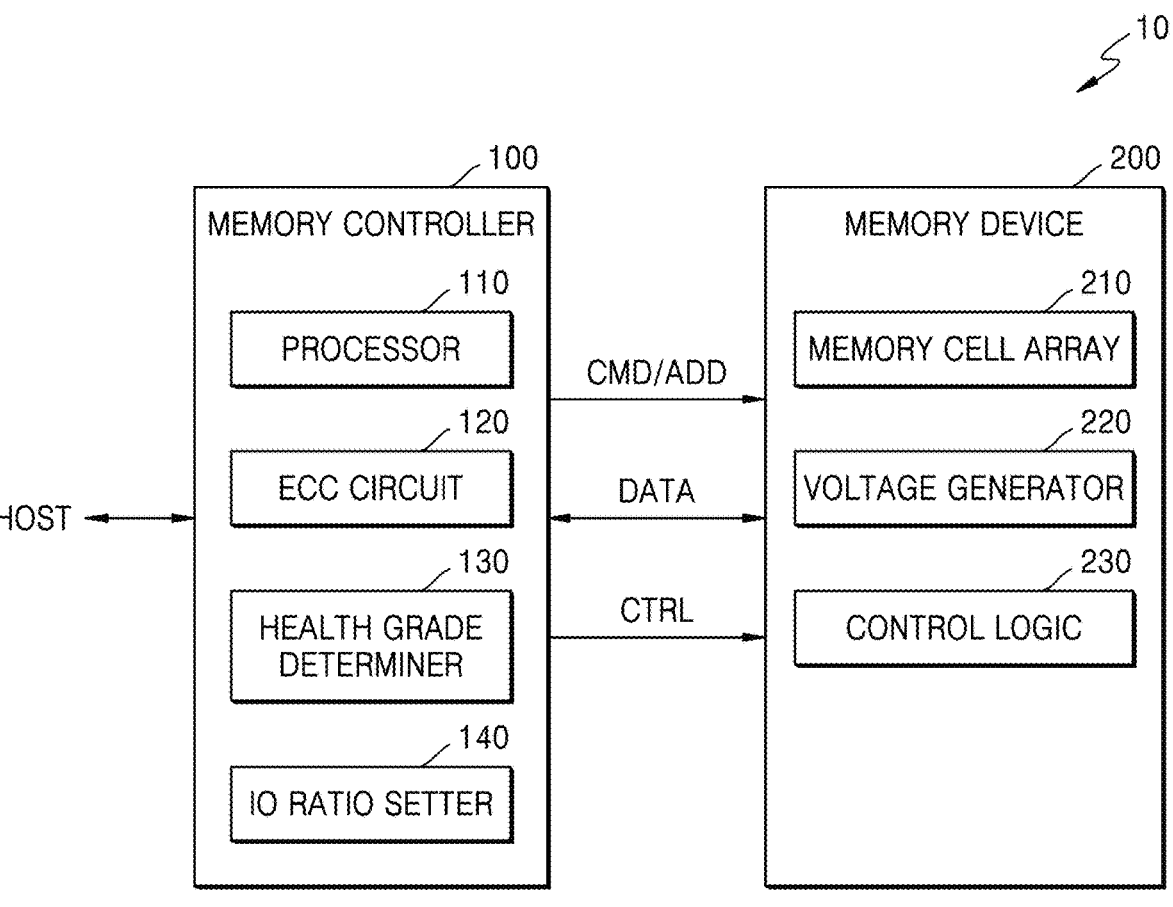
FIG. 1 is a block diagram illustrating an example of a memory system.

FIG. 1 is a block diagram illustrating an example of a memory system 10.

Referring to FIG. 1, the memory system 10 includes a memory controller 100 and a memory device 200, and the memory device 200 may include a memory cell array 210, a voltage generator 220, and a control logic 230.

For example, the memory system 10 may communicate with a host through various interfaces, e.g., a universal serial bus (USB) interface, a multimedia card (MMC) interface, an embedded multimedia card (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a Firewire interface, a universal flash storage (UFS) interface, and a nonvolatile memory express (NVMe) interface.

According to some implementations, the memory device 200 may include an NVM device, such as flash memory. In some implementations, the memory system 10 may be implemented by an embedded or detachable memory in an electronic device, and for example, the memory system 10 may be implemented in various forms, such as an embedded UFS memory device, an eMMC, a solid state drive (SSD), a UFS memory card, a compact flash (CF) card, a secure digital (SD) card, a micro-SD card, a mini-SD card, an extreme digital (xD) card, and a memory stick. In addition, the memory system 10 may be referred to as a storage device when data is stored in a nonvolatile manner.

The memory controller 100 may control the memory device 200 in response to a write/read request from a host so that data stored in the memory device 200 is read or data is written on the memory device 200. For example, the memory controller 100 may include a processor 110, and the processor 110 may control a general internal operation of the memory controller 100 and control a memory operation on the memory device 200. Particularly, the memory controller 100 may control write, read, and erase operations on the memory device 200 by providing an address ADD, a command CMD, and a control signal CTRL to the memory device 200. In addition, data DATA to be stored in the memory device 200 and the data DATA read from the memory device 200 may be exchanged between the memory controller 100 and the memory device 200.

The memory cell array 210 may include a plurality of memory cells, e.g., flash memory cells. Hereinafter, the implementations are described in detail by assuming that the plurality of memory cells are NAND flash memory cells. However, the inventive concept is not limited thereto, and in some implementations, the plurality of memory cells may be resistive memory cells, such as resistive random access memory (ReRAM), phase change random access memory (PRAM), or magnetic random access memory (MRAM).

In some implementations, the memory cell array 210 may include a three-dimensional memory cell array, the three-dimensional memory cell array may include a plurality of NAND strings, and each NAND string may include memory cells respectively connected to word lines vertically stacked on a substrate. However, the inventive concept is not limited thereto, and in some implementations, the memory cell array 210 may include a two-dimensional memory cell array, and the two-dimensional memory cell array may include a plurality of NAND strings in row and column directions.

The voltage generator 220 may generate various kinds of voltages, e.g., a program voltage for a program operation and a read voltage for a read operation, to be used in the memory device 200. In addition, the voltage generator 220 may variously adjust the levels of the program voltage and the read voltage based on control by the control logic 230.

The control logic 230 may control a general operation of the memory device 200, for example, output various kinds of internal control signals for programming data on the memory cell array 210 or reading data from the memory cell array 210, based on the command CMD, the address ADD, and the control signal CTRL received from the memory controller 100. In addition, the control logic 230 may output a voltage control signal (not shown) for adjusting the levels of the various kinds of voltages to be output from the voltage generator 220 in relation to a program operation, a read operation, and an erase operation.

The memory system 10 may perform a memory operation in response to a request from the host, and the memory controller 100 may provide write data to the memory device 200 or receive read data from the memory device 200. That is, the memory controller 100 may perform a host input/output (IO) with the memory device 200 in response to a request from the host.

In addition, the memory system 10 may perform a background operation as an internal process irrelevant to a request from the host, and for example, the background operation may include various kinds of operations, such as reclaim (or read reclaim) and garbage collection. For example, the memory system 10 may copy data stored in a degraded block (or a source block) to another block (or a destination block) by performing a reclaim operation and may also generate a new free block by selectively copying valid data stored in a plurality of source blocks to one or more destination blocks in a garbage collection operation. In such a background operation, data read from the memory device 200 may be provided to the memory controller 100, and in addition, data may be provided from the memory controller 100 to the memory device 200 to copy the data. That is, the memory controller 100 may perform an internal IO with the memory device 200 in relation to a background operation.

For example, during a period until reclaim is completed after the reclaim was triggered, the memory system 10 may perform both a reclaim operation and a memory operation in response to a request from the host. For example, according to a certain set ratio, the memory controller 100 may transmit and receive data to and from the memory device 200 in response to a request from the host and in relation to a background operation irrelevant to a request from the host.

The memory controller 100 may set an IO ratio indicating a performing ratio of an internal IO operation ("internal IO") to a host IO operation ("host IO", or the other way, and perform the host IO and the internal IO according to the set IO ratio. Accordingly, as the performing ratio of the host IO is set high, a response to a request from the host may be quickly provided, and thus, the performance of the memory system 10 may be improved. However, as the performing ratio of the internal IO is set low, the time taken for the background operation increases because the speed of a background operation decreases, and thus, data stored in a degraded block may be lost, thereby increasing the possibility of the occurrence of an uncorrectable error correction code (UECC) error.

On the contrary, as the performing ratio of the internal IO is set high, the time taken for the background operation decreases because the speed of the background operation increases, and thus, the possibility of the occurrence of a UECC error may decrease, thereby improving data stability. However, when the performing ratio of the host IO is set low, a response to a request from the host may be delayed, and thus, the performance of the memory system 10 may degrade. That is, it is necessary to perform an efficient background operation such that the performance of a response to the host is not degraded while maintaining the reliability of the memory system 10.

Some example implementations are described below.

The memory controller 100 may further include an error correction code (ECC) circuit 120, a health grade determining circuit 130, and an IO ratio setting circuit 140. The ECC circuit 120 may perform an error detecting operation and an error correction operation based on a certain algorithm, on data read from the memory device 200. For example, the ECC circuit 120 may detect the number of errors that occurred or a bit error rate (BER) in a certain error detecting unit (e.g., a page unit), and the memory controller 100 may determine whether to perform a background operation in a block unit, according to an error detecting result. In the description of implementations below, although a reclaim operation is described as an example of a background operation, implementations are applicable to other various types of background operations in which an internal IO is performed. In addition, an error detecting result may include various kinds of detecting results including the number of errors that occurred, a BER, and the like with respect to data of a certain error detecting unit.

, the health grade determining circuit 130 may determine the health grade of a block on which reclaim is to be performed. In addition, the IO ratio setting circuit 140 may adjust the speed of a reclaim operation by setting a ratio between a host IO and an internal IO for performing a reclaim operation on a corresponding block, based on the determined health grade. For example, if the ratio of the host IO is set high, a data transmission and reception frequency according to a request from the host may increase between the memory controller 100 and the memory device 200. Otherwise, if the ratio of the internal IO is set high, a data transmission and reception frequency for a reclaim operation may increase between the memory controller 100 and the memory device 200.

If it is determined based on error detecting or the like that the reliability of a block is degraded, a reclaim operation on the block may be triggered. In this case, it is necessary that the reclaim operation on the block is completed before a UECC error occurs, and the memory controller 100 may set an IO ratio for completing the reclaim operation within a read reclaim (RR) to UECC value (the allowed number of reads after reclaim triggering). For example, when the RR to UECC value is large, a relatively large number of read operations are allowed even after reclaim is triggered, and thus, a host IO ratio may be set high when the IO ratio is set. However, because the reliability of a flash memory device, such as VNAND, may decrease due to a cause, such as an increase in the number of stages or the like in the flash memory device, the RR to UECC value may decrease, and thus, there may be limitations on how high the host IO ratio may be set. In addition, when the IO ratio is calculated based on a worst case of the RR to UECC values of a plurality of NAND chips included in a flash memory device and a plurality of blocks included in each NAND chip, the performing frequency of the host IO may further decrease.

On the other hand, an IO ratio may be set based on a health grade determined on a block on which a reclaim operation is to be actually performed instead of based on the RR to UECC value of a most degraded block, and thus setting the host IO ratio excessively lower than an actual degree of degradation of a block may be prevented or avoided, thereby maintaining the optimal performance of the memory system 10. For example, according to error detecting results of blocks on which reclaim is to be performed, IO ratios of different values may be set for the blocks.

In addition, in implementations, the health grade determining circuit 130 may further receive block information (not shown) related to a plurality of blocks included in the memory cell array 210 and determine the health grade of each block based on a combination of an error detecting result and the block information. For example, the block information may include at least some of pieces of information, such as a block write/erase count value, a current temperature, a block location (or block address information), and a reliability index (RI). The block information may be stored in the memory device 200 in a nonvolatile manner and provided to the memory controller 100 when the memory system 10 is initially driven. Alternatively, the block information may be stored in a storing circuit (not shown) of the memory controller 100 in a nonvolatile manner and provided to the health grade determining circuit 130 when a health grade is determined.

In addition, a portion of the block information may be determined through a test in a manufacturing process of the memory system 10 and stored in the memory controller 100 and/or the memory device 200. In addition, the other portion of the block information may be detected or determined during an operation of the memory system 10 and determined and changed through various kinds of circuits in the memory controller 100 and/or the memory device 200. A health grade may be differently determined for each block based on the various kinds of information described above, and the health grade may be related to the RR to UECC value of a corresponding block.

Although it is shown in the implementation of FIG. 1 that the health grade determining circuit 130 and the IO ratio setting circuit 140 are separate function blocks in the memory controller 100, the health grade determining circuit 130 and the IO ratio setting circuit 140 may be implemented by software and loaded and executed in a working memory (not shown) in the memory controller 100. In some implementations, when the memory system 10 is a flash memory system, the memory controller 100 may include a flash translation layer (FTL) including firmware and the health grade determining circuit 130 and the IO ratio setting circuit 140 may be included in the FTL.

In addition, although it has been described above that the IO ratio setting refers to block information, this term may be variously defined. For example, IO ratio setting may refer to various kinds of information that influence the reliability of the memory device 200, e.g., chip unit information, information detected from the memory system 10, and other kinds of information. That is, in certain implementations, block information may include not only information related to a corresponding block but also various kinds of information which may be related to the reliability of the memory system 10.

Figure 2:
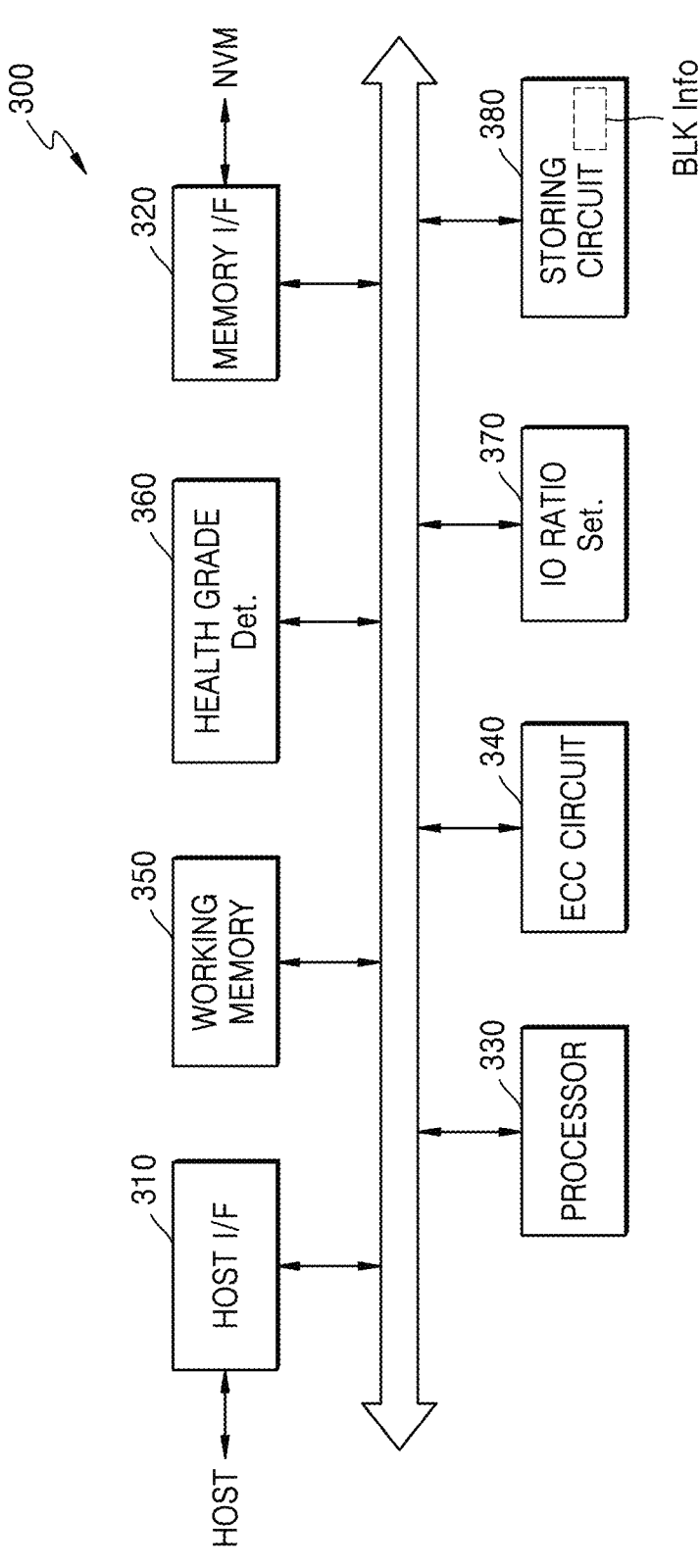
FIG. 2 is a block diagram illustrating an example of a memory controller.

FIG. 2 is a block diagram illustrating a memory controller 300.

Referring to FIG. 2, the memory controller 300 may include a host interface 310, a memory interface 320, a processor 330, an ECC circuit 340, a working memory 350, a health grade determining circuit 360, an IO ratio setting circuit 370, and a block information storing circuit 380. The processor 330 may control a general operation of the memory controller 300 by executing firmware loaded in the working memory 350. For example, the memory controller 300 may output a command/address and a control signal for controlling a host IO and an internal IO of a memory device (e.g., an NVM device), under control by the processor 330.

The working memory 350 may be implemented by various kinds of memories, e.g., at least one of cache memory, dynamic random access memory (DRAM), static random access memory (SRAM), PRAM, and MRAM. In addition, as an example of the firmware, an FTL may be loaded in the working memory 350, and various functions related to a flash memory operation may be performed by driving the FTL.

The host interface 310 may communicate with a host through various kinds of interfaces according to the implementation described above. In addition, the memory interface 320 provides a physical connection between the memory controller 300 and the memory device. For example, a command/address, data, and the like may be exchanged between the memory controller 300 and the memory device through the memory interface 320.

The ECC circuit 340 may perform ECC encoding processing on data requested to be written and may perform ECC decoding processing on read data. The ECC circuit 340 may generate an error detecting result by performing ECC decoding processing on certain-unit data read from the memory device. For example, data read from a page of a block according to reading in response to a request from the host or internal reading of a memory system may be provided to the ECC circuit 340, and whether reclaim on the block is performed may be determined based on an error detecting result of the ECC circuit 340. For example, if the number of errors that occurred in the read data is greater than a certain reference value, or if the BER of the read data is greater than a certain reference value, the block may be selected as a reclaim target.

The block information storing circuit 380 may include storing elements storing certain information in a nonvolatile manner and store pieces of block information BLK Info about a plurality of blocks included in the memory device. For example, a test process on a plurality of blocks included a chip (e.g., a NAND chip) may be performed in a manufacturing process of the memory system, and the reliability index (RI) of the NAND chip and/or the plurality of blocks may be measured and stored in the block information storing circuit 380.

The health grade determining circuit 360 may determine the health grade of a block on which reclaim is to be performed, by using at least some of the error detecting result of the ECC circuit 340, block information BLK Info from the block information storing circuit 380, and pieces of information provided from various kinds of circuits included in the memory system. In addition, according to the implementation described above, the IO ratio setting circuit 370 may set an IO ratio related to a reclaim operation on the block on which reclaim is to be performed, based on the health grade determined for the block on which reclaim is to be performed. For example, a block determined to have a health grade indicating a relatively low degree of degradation may be set to have a higher performing ratio of a host IO than a block determined to have a health grade indicating a relatively high degree of degradation.

Each of the health grade determining circuit 360 and the IO ratio setting circuit 370 shown in FIG. 2 may be implemented by a hardware circuit or software executed by the processor 330. Alternatively, each of the health grade determining circuit 360 and the IO ratio setting circuit 370 may be configured to have a combination of hardware and software. In addition, although it is shown in the implementation of FIG. 2 that the health grade determining circuit 360 and the IO ratio setting circuit 370 are separate components, in implementations, the health grade determining circuit 360 and the IO ratio setting circuit 370 may be described as components implemented in any one function block.

Figure 3:
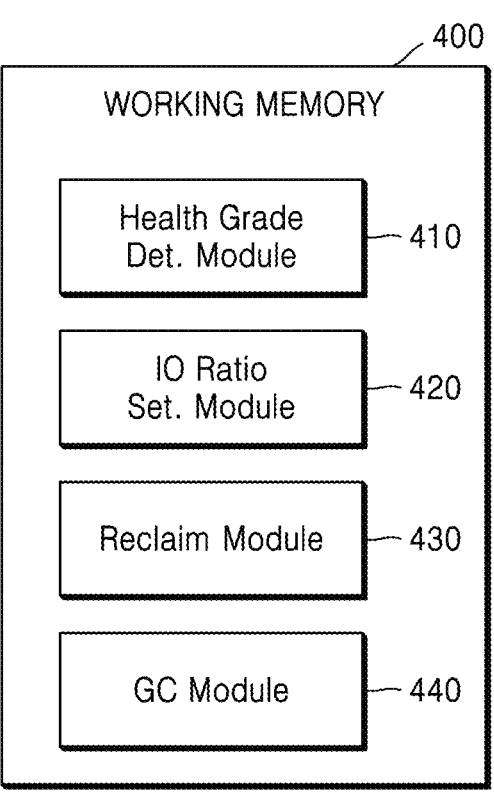
FIG. 3 is a block diagram illustrating an example in which an input/output (IO) ratio setting is performed by software.

FIG. 3 is a block diagram illustrating an example in which IO ratio setting is performed by software.

Referring to FIG. 3, the health grade determination function and the IO ratio setting function in the implementation described above may be implemented as software. According to one example, the health grade determination function may be implemented by software of a health grade determination module 410, the IO ratio setting function may be implemented by software of an IO ratio setting module 420, and the health grade determination module 410 and the IO ratio setting module 420 may be loaded in a working memory 400. In addition, a reclaim module 430 configured to control a reclaim operation as a background operation and a garbage collection module 440 configured to control a garbage collection operation as a background operation may be further loaded in the working memory 400. As described above, an FTL may be loaded in the working memory 400 in the form of firmware, and the health grade determination module 410 and the IO ratio setting module 420 may be described as components included in the FTL.

Figure 4:
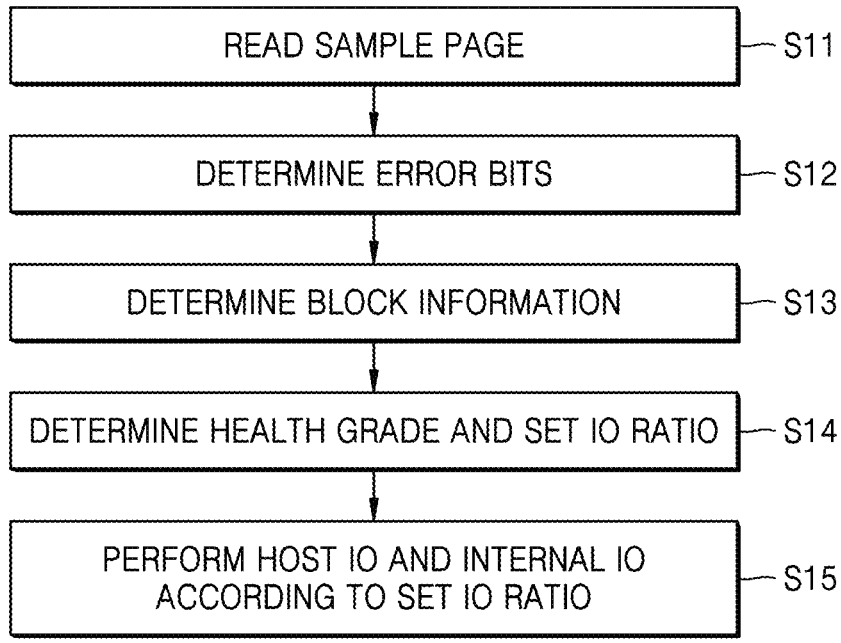
FIG. 4 is a flowchart illustrating an example of an operation method of a memory system.

FIG. 4 is a flowchart illustrating an operation method of a memory system.

Referring to FIG. 4, a block (hereinafter, referred to as a first block) may be selected as a reclaim target based on read in response to a request from a host, patrol read of a memory system, read interval neighbor check (RINC), or the like. If the first block is selected as a reclaim target, a read operation on at least one sample page included in the first block may be performed in operation S11, and error bits may be determined by an error detecting operation on read data in operation S12. Accordingly, current error bits existing in the first block on which reclaim is to be performed may be identified.

The at least one sample page may be selected from among a plurality of pages included in the first block, and sample pages at the same or different locations may be set for a plurality of blocks. For example, in each block, a sample page may correspond to at least one page having relatively low reliability among a plurality of pages. In addition, in an implementation, a sample page set for each block may be tested and determined in a manufacturing process of a memory device, and information indicating the location of the sample page may be stored in the memory device or a memory controller.

In addition, block information of the first block may be determined in operation S13, and according to the implementations described above, the block information may include various pieces of information, such as pre-stored information, pieces of information (e.g., a write/erase count value, temperature information, and the like) generated by various kinds of circuit blocks in the memory system, and a block address indicating the location of the first block. In addition, in operation S14, the health grade of the first block may be determined based on a combination of an error detecting result and the block information and the IO ratio of the first block may also be set based on a result of the determination of the health grade. An RR to UECC value of the first block may be calculated or estimated according to the determined health grade, and a ratio between a host IO and an internal IO may be set to correspond to the determined health grade. In addition, in a process of performing reclaim on the first block, a host IO and an internal IO may be performed according to the set ratio in operation S15.

Although it is illustrated in the description above that reclaim is triggered based on an error detecting result of a random page by a host request or internal reading and a health grade is determined based on an error detecting result of a sample page, implementations may be variously modified. For example, a health grade may be determined based on an error detecting result of a random page by a host request or internal reading. Alternatively, a health grade may be determined by combining an error detecting result of a random page and an error detecting result of a sample page.

Figure 5:
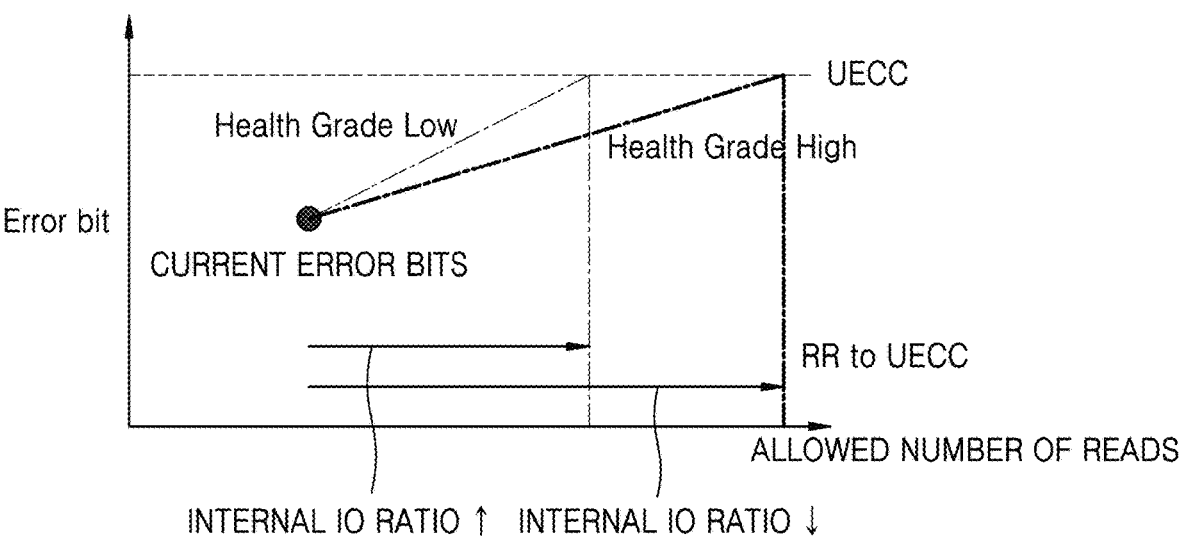
FIG. 5 is a graph illustrating an example in which an IO ratio is differently set in correspondence to a read reclaim to uncorrectable error correction code (RR to UECC) value.

FIG. 5 is a graph illustrating an example in which an IO ratio is differently set according to an RR to UECC value.

Referring to FIG. 5, when reclaim on a first block is triggered, data may be read from a sample page of the first block and current error bits may be detected from data of the sample page. In addition, the degree of degradation of the first block may vary according to the state of the first block, and a health grade related to the RR to UECC value of the first block may be determined based on block information according to the implementations described above. As a health grade determination result, if it is determined that the degree of degradation of the first block is low, the RR to UECC value of the first block may be calculated to be relatively large, whereas, if it is determined that the degree of degradation of the first block is high, the RR to UECC value of the first block may be calculated to be relatively small.

If it is determined that the first block has a low health grade, the allowed number of reads before a UECC error occurs is small, and thus, it is necessary that the internal IO ratio of the first block is set to be relatively higher than in a case where a health grade is high. Otherwise, if it is determined that the first block has a high health grade, the allowed number of reads before a UECC error occurs is large, and thus, the internal IO ratio of the first block is set to be relatively lower than in a case where a health grade is low. That is, when reclaim on any one block is performed, according to the degree of degradation of a block, the speed of a reclaim operation may be increased by setting an internal IO ratio high (or setting a host IO ratio low) or a response to a request from a host may be quickly provided by setting the internal IO ratio low (or setting the host IO ratio high).

Figure 6:
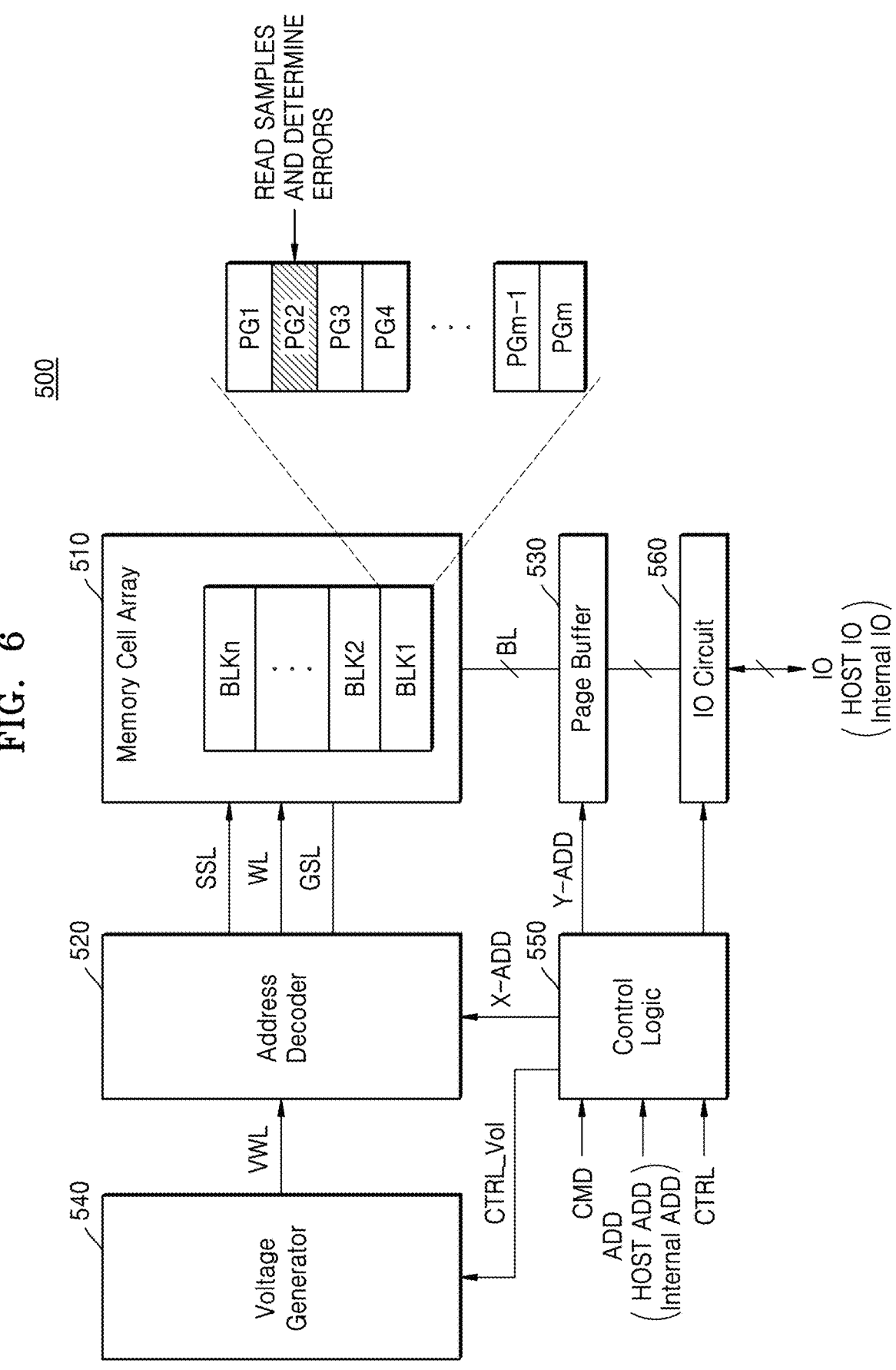
FIG. 6 is a block diagram illustrating an example of a memory device.

FIG. 6 is a block diagram illustrating a memory device 500.

Referring to FIG. 6, the memory device 500 may include a memory cell array 510, an address decoder 520, a page buffer 530, a voltage generator 540, a control logic 550, and an IO circuit 560. Although not shown in FIG. 6, the memory device 500 may further include an IO interface.

The memory cell array 510 may be connected to word lines WL, string select lines SSL, ground select lines GSL, and bit lines BL. The memory cell array 510 may be connected to the address decoder 520 through the word lines WL, the string select lines SSL, and the ground select lines GSL and connected to the page buffer 530 through the bit lines BL. The memory cell array 510 may include a plurality of memory blocks BLK1 to BLKn.

Each of the plurality of memory blocks BLK1 to BLKn may include a plurality of pages PG1 to PGm. Each of the plurality of pages PG1 to PGm may correspond to a data program or read unit in one memory block. In some implementations, memory cells included in each of the plurality of pages PG1 to PGm may be connected to the same word line. The address decoder 520 may select one of the plurality of memory blocks BLK1 to BLKn in the memory cell array 510, select one of the word lines WL of the selected memory block, and select one of the string select lines SSL.

The control logic 550 may output various kinds of control signals for performing program, read, and erase operations on the memory cell array 510, based on the command CMD, the address ADD, and the control signal CTRL. The control logic 550 may provide a row address X-ADD to the address decoder 520, provide a column address Y-ADD to the page buffer 530, and provide a voltage control signal CTRL_Vol to the voltage generator 540.

In some implementations, the control logic 550 may perform a reclaim operation in a unit of each of the plurality of memory blocks BLK1 to BLKn. For example, the control logic 550 may perform a read operation on pages of a source block for which reclaim has been triggered among the plurality of memory blocks BLK1 to BLKn, copy the read data to a destination block, and perform an erase operation on the source block after the copy operation is completed. In addition, the control logic 550 may control a garbage collection operation on the plurality of memory blocks BLK1 to BLKn, e.g., selectively read valid data stored in two or more source blocks and copy the read valid data to one or more destination blocks. The number of source blocks may be greater than the number of destination blocks, and accordingly, one or more blocks may be free based on the garbage collection operation.

The page buffer 530 may operate as a write driver or a sense amplifier according to an operation mode. In a read operation, the page buffer 530 may sense a bit line BL of a memory cell selected under control by the control logic 550. The page buffer 530 may dump sensed data to the IO circuit 560 under control of the control logic 550. The IO circuit 560 may transmit and receive various kinds of signals/data to and from a memory controller (not shown) outside the memory device 500, and the host IO and the internal IO in the implementations described above may be performed through the IO circuit 560.

The control logic 550 may receive, from the memory controller, an address (e.g., a host address HOST ADD) for a memory operation according to a request from a host or an address (e.g., an internal address Internal ADD) for an internal processing operation, such as a reclaim operation. In addition, when performing an IO operation with the memory controller, the IO circuit 560 may perform a host IO for transmitting and receiving data in response to a request from the host or perform an internal IO for transmitting and receiving data related to an internal processing operation, such as a reclaim operation. In addition, according to the implementations described above, the health grade of a block for which reclaim has been triggered among the plurality of memory blocks BLK1 to BLKn may be determined, and a ratio between a host IO and an internal IO for the block may be set according to a result of the determination.

In addition, a sample page may be set for each of the plurality of memory blocks BLK1 to BLKn, and the sample page may include one or more pages in each block. Address information of a sample page may be generated through a test operation in a manufacturing process of the memory device 500 and stored in the memory device 500 and/or the memory controller. Alternatively, the error occurrence frequencies of pages in a block may be detected while driving the memory device 500, and at least one page having the lowest reliability may be determined as a sample page. FIG. 6 illustrates a case where a second page PG2 in a first block BLK1 is set as a sample page, and pages at different locations may be set as sample pages for other blocks.

Figure 7:
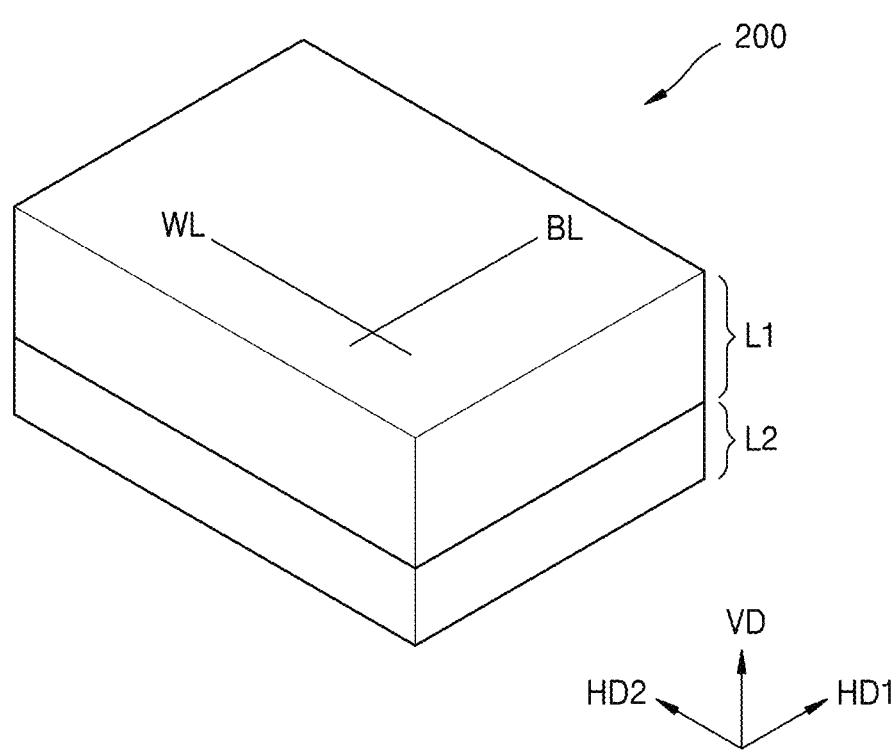
FIG. 7 is a perspective view schematically illustrating a structure of an example of a memory device of FIG. 1.

FIG. 7 is a perspective view schematically illustrating a structure of the memory device 200 of FIG. 1.

Referring to FIGS. 1 and 7, the memory device 200 may include a first semiconductor layer L1 and a second semiconductor layer L2, and the first semiconductor layer L1 may be stacked in a vertical direction VD with respect to the second semiconductor layer L2. Particularly, the second semiconductor layer L2 may be beneath the first semiconductor layer L1 in the vertical direction VD. In an implementation, the memory cell array 210 of FIG. 1 may be formed in the first semiconductor layer L1, and a peripheral circuit (not shown) configured to drive the memory cell array 210 may be formed in the second semiconductor layer L2. Accordingly, the memory device 200 may have a structure in which the memory cell array 210 is on the peripheral circuit, i.e., a cell over periphery (COP) structure. The COP structure may reduce an area in a horizontal direction and improve the integration of the memory device 200.

After forming the peripheral circuit in the second semiconductor layer L2, the first semiconductor layer L1 including the memory cell array 210 may be formed, and metal patterns may be formed for electrically connecting the word lines WL and the bit lines BL of the memory cell array 210 to the peripheral circuit formed in the second semiconductor layer L2. For example, the bit lines BL may extend in a first horizontal direction or first direction HD1, and the word lines WL may extend in a second horizontal direction or second direction HD2.

Figure 8:
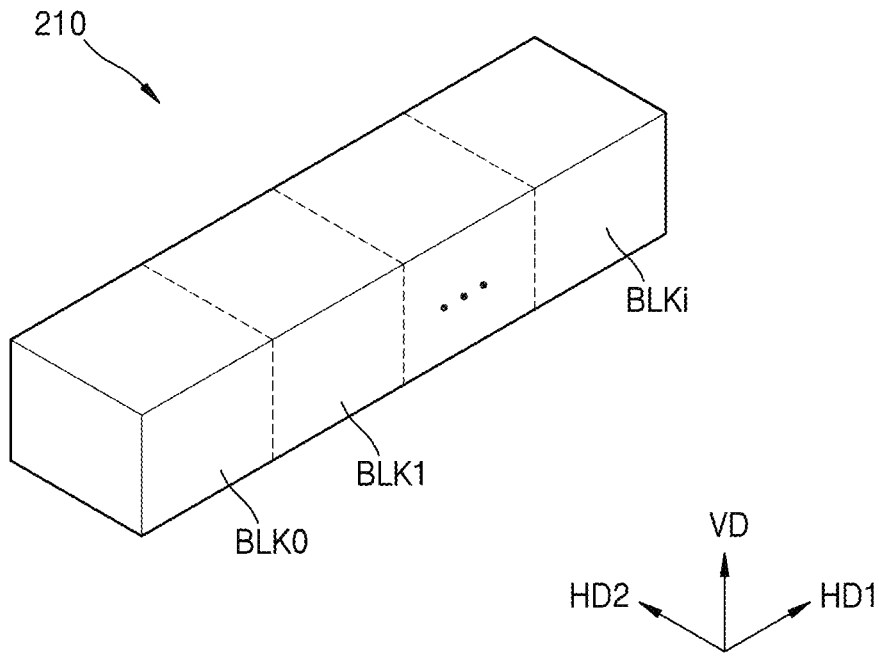
FIG. 8 is a perspective view illustrating a memory cell array of FIG. 1.

FIG. 8 is a perspective view illustrating the memory cell array 210 of FIG. 1.

Referring to FIG. 8, the memory cell array 210 may include a plurality of memory blocks BLK0 to BLKi, where i may be a positive integer. Each of the plurality of memory blocks BLK0 to BLKi may have a three-dimensional structure (or a vertical structure). Each of the plurality of memory blocks BLK0 to BLKi may include a plurality of NAND strings extending in the vertical direction VD. Herein, the plurality of NAND strings may be provided to be separated from each other by a particular distance in the first and second directions HD1 and HD2.

Figure 9:
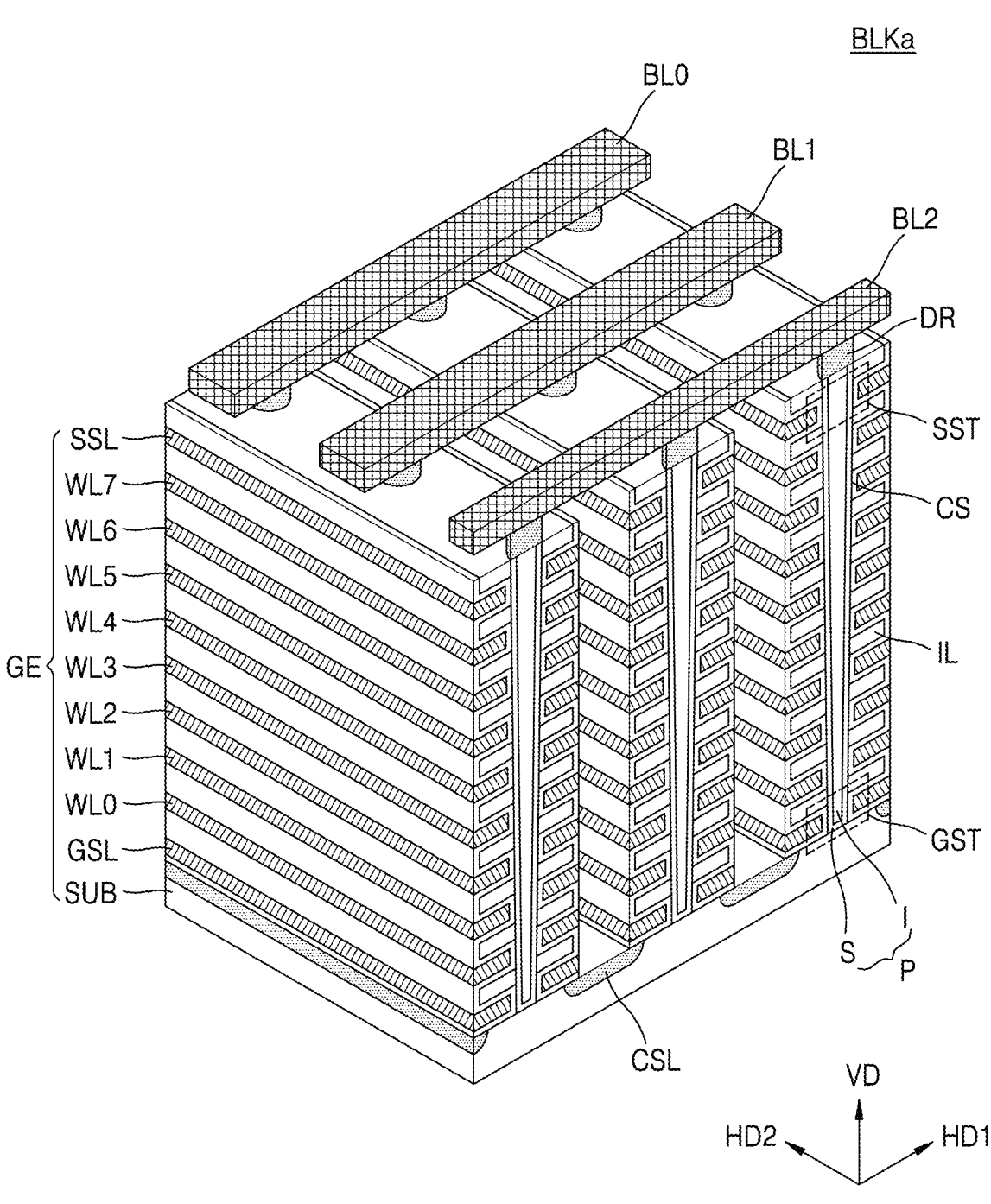
FIG. 9 is a perspective view illustrating an example of a memory block.

FIG. 9 is a perspective view illustrating a memory block BLKa.

Referring to FIG. 9, the memory block BLKa may correspond to one of the plurality of memory blocks BLK0 to BLKi of FIG. 8. The memory block BLKa is formed in the vertical direction VD with respect to a substrate SUB having a first conductive type (e.g., a p type). A common source line CSL doped with impurities of a second conductive type (e.g., an n type) may be provided on the substrate SUB. The substrate SUB may be implemented by polysilicon, and the common source line CSL of a plate type may be on the substrate SUB. A plurality of insulating layers IL extending in the second direction HD2 are sequentially provided in the vertical direction VD on the substrate SUB, and the plurality of insulating layers IL are separated from each other by a particular distance in the vertical direction VD. For example, the plurality of insulating layers IL may include an insulating material, such as silicon oxide.

A plurality of pillars P sequentially arranged in the first direction HD1 and passing through the plurality of insulating layers IL in the vertical direction VD are provided on the substrate SUB. For example, the plurality of pillars P may be in contact with the substrate SUB by passing through the plurality of insulating layers IL. Particularly, a surface layer S of each pillar P may include a silicon material having a first type and function as a channel region. Accordingly, a pillar P may be referred to as a vertical channel structure. An internal layer I of each pillar P may include an insulating material, such as silicon oxide, or an air gap.

A charge storage layer CS is provided along exposed surfaces of insulating layers IL, pillars P, and the substrate SUB. The charge storage layer CS may include a gate insulating layer, a charge trap layer, and a blocking insulating layer. For example, the charge storage layer CS may have an oxide-nitride-oxide (ONO) structure. In addition, a gate electrode GE including a ground select line GSL, a string select line SSL, and word lines WL0 to WL7 is provided to an exposed surface of the charge storage layer CS. In addition, the charge storage layer CS, the surface layer S, and the ground select line GSL may function as a gate select transistor GST. The charge storage layer CS, the surface layer S and the string select line SSL may function as a string select transistor SST. Drains DR are provided on the plurality of pillars P. For example, the drains DR may include a silicon material doped with impurities having the second conductive type. Bit lines BL1 to BL3 extending in the first direction HD1 and separated from each other by a particular distance in the second direction HD2 are provided on the drains DR.

FIGS. 10A and 10B are tables illustrating a health grade determination example. In the implementations shown in FIGS. 10A and 10B, although only a block address, a write/erase cycle related to endurance, temperature information, and a chip reliability index RI are illustrated as block information together with an error detecting result of a sample page, in other implementations, various other kinds of block information may be used to determine a health grade.

Referring to FIG. 10A, an error detecting result and each piece of temperature information may be classified into a plurality of steps, and a certain point (e.g., a health point) may be assigned to each step of the classification. As a health point value decreases, a block characteristic may increase, and in implementations, a health grade may be calculated by summing up health point values of a plurality of factors (e.g., an error detecting result and block information) and may also be classified into a plurality of grades according to the summed value. In addition, although an example of summing up health points is shown in FIGS. 10A and 10B, implementations are not limited thereto, and a health grade may be calculated by computing the health points in various ways. For example, in summing up health points, a weight computation may be performed by weighting at least some factors. Accordingly, when a health grade is determined, if the importance of an error detecting result is increased, a weight of a relatively large value may be assigned to the error detecting result.

For example, an error detecting result may indicate a ratio of the number of error bits which occurred in a sample page to the number of error bits correctable by an ECC circuit employed in a memory system, and it may be determined that the degree of degradation of a block decreases as the ratio decreases. For example, a health point may have a value of 1 when an error detecting result has a value less than 60%, whereas a health point may have a value of 5 when an error detecting result has a value greater than 90%.

As another example, a health point may have any one value from among 1 to 5 according to a temperature result of the inside of a memory controller or a memory device. Although it is illustrated in FIG. 10A that a health point has a lower value as a temperature increases, implementations are not limited thereto, and a health point may be set in various ways. For example, if a data retention characteristic is the best when an internal temperature has a value of about 20 degrees to about 60 degrees, a health point of the least value may be set when a temperature is about 20 degrees to about 60 degrees, and a health point of a greater value may be set when the temperature is less than or equal to 20 degrees or greater than or equal to 60 degrees.

As another example, the endurance of a block may be determined based on various pieces of block information, and for example, the endurance of a block may decrease as the write/erase count value of the block increases. For example, a write/erase count threshold allowed to the block may be defined, and a health point according to a ratio of the current write/erase count value of the block to the write/erase count threshold. For example, if it is determined that the ratio is less than 30%, a health point may have a value of 1, and if it is determined that the ratio is greater than 90%, a health point may have a value of 5.

As another example, a block address may indicate the location of a block in a memory device, and in the example shown in FIG. 10A, the block may have a location with a good characteristic (e.g., a location in a center region) when a block address value is small, and have a location with a bad characteristic (e.g., a location in an edge region) when a block address value is large. For example, the process characteristic of a block located in an edge region may be lower than that of a block located in a center region due to process restrictions and difficulty, and accordingly, a small health point value may be set as the block address value decreases, whereas a large health point value may be set as the block address value increases.

As another example, an RI of a chip may be applied to determine the health grade of each block. For example, a test may be performed on a wafer having a plurality of chips formed thereon, and an index indicating reliability for each chip may be calculated and stored in a corresponding chip. The RI may be defined as a plurality of steps, and FIG. 10A illustrates a case where A indicating relatively high reliability to E indicating relatively low reliability are defined. In implementations, a health point according to the RI of a chip may be commonly applied to a plurality of blocks included in a chip. That is, even though all the health points of the factors other than the RI are the same, a different IO ratio may be set for each chip according to the RI.

FIG. 10B illustrates health grades of a plurality of steps calculated based on the health points shown in FIG. 10A. FIG. 10B shows an example of determining a health grade by summing up the health points of a plurality of factors, and for example, a first health grade as the lowest health grade has 20 to 25 as a value obtained by summing up health points, and in this case, an internal IO ratio may have a relatively high value. For example, it is necessary to perform a plurality of internal IO operations in order to perform reclaim on any one block, and a ratio between a host IO and an internal IO during a reclaim period may be set to 90:10.

On the contrary, a fourth health grade as the highest health grade has 5 to 10 as a value obtained by summing up health points, and in this case, an internal IO ratio may have a relatively low value. For example, a ratio between a host IO and an internal IO during a reclaim period may be set to 99:1. That is, because a large number of reads are allowed to a block having the highest health grade until a UECC error occurs, a host IO ratio may relatively increase.

The numeric values illustrated in FIGS. 10A and 10B are only illustrative, and in implementations, a health grade may be determined based on a combination of various different types of block information, and an IO ratio may also be set to a different value. In addition, setting health points and determining a health grade based on calculation of the health points may be performed in other various ways.

FIG. 11 is a block diagram illustrating a memory system 600. FIG. 11 illustrates an example of generating and transferring various kinds of information to be used in relation to health grade determination. Although not shown in FIG. 11, a memory controller 610 may further include various components, such as a processor, a command/address generator, and a command queue, as components configured to perform an IO with a memory device 620.

Referring to FIG. 11, the memory system 600 may include the memory controller 610 and the memory device 620, and the memory controller 610 and the memory device 620 may exchange a command/address CMD/ADD and data DATA with each other. The memory controller 610 may include a temperature sensor 611, a counter 612, an ECC circuit 613, and a health grade determining circuit 614. In addition, the memory device 620 may include a memory cell array 621 and a control logic 622.

In an initial operation of the memory system 600, various kinds of information for operating the memory system 600 may be provided from the memory device 620 to the memory controller 610. For example, the memory cell array 621 may store at least one piece of block information BLK Info to be used for health grade determination, and the at least one piece of block information BLK Info may be provided to the memory controller 610. The memory cell array 621 may include one or more NAND chips, each NAND chip may include a plurality of blocks, and the at least one piece of block information BLK Info may include information related to the reliability of each of the plurality of blocks together with information related to the reliability of a NAND chip unit. The information related to the reliability may include various pieces of information, e.g., information indicating that the data retention characteristic of each block is high or low. In addition, the at least one piece of block information BLK Info may be information generated and stored in a manufacturing process of the memory device 620 and having fixed values. Alternatively, the at least one piece of block information BLK Info may be information having values changed and updated along with the progress of an operation of the memory device 620 and may further include, for example, information indicating the progressing state of degradation of blocks and information about a block determined as a bad block.

According to the implementations described above, the health grade determining circuit 614 may determine the health grade of a block by using an error detecting result (e.g., an error detecting result of a sample page) and the at least one piece of block information BLK Info. For example, the health grade determining circuit 614 may receive temperature information from the temperature sensor 611, receive a block write/erase cycle count value from the counter 612, receive an error detecting result from the ECC circuit 613, and receive the at least one piece of block information BLK Info described above.

In the implementation shown in FIG. 11, because the temperature sensor 611 is included in the memory device 620, the temperature information may be provided from the memory device 620 to the memory controller 610. In addition, the at least one piece of block information BLK Info to be used for health grade determination may be stored in the memory controller 610. Alternatively, the at least one piece of block information BLK Info may be stored in both the memory controller 610 and the memory device 620.

Figure 12:
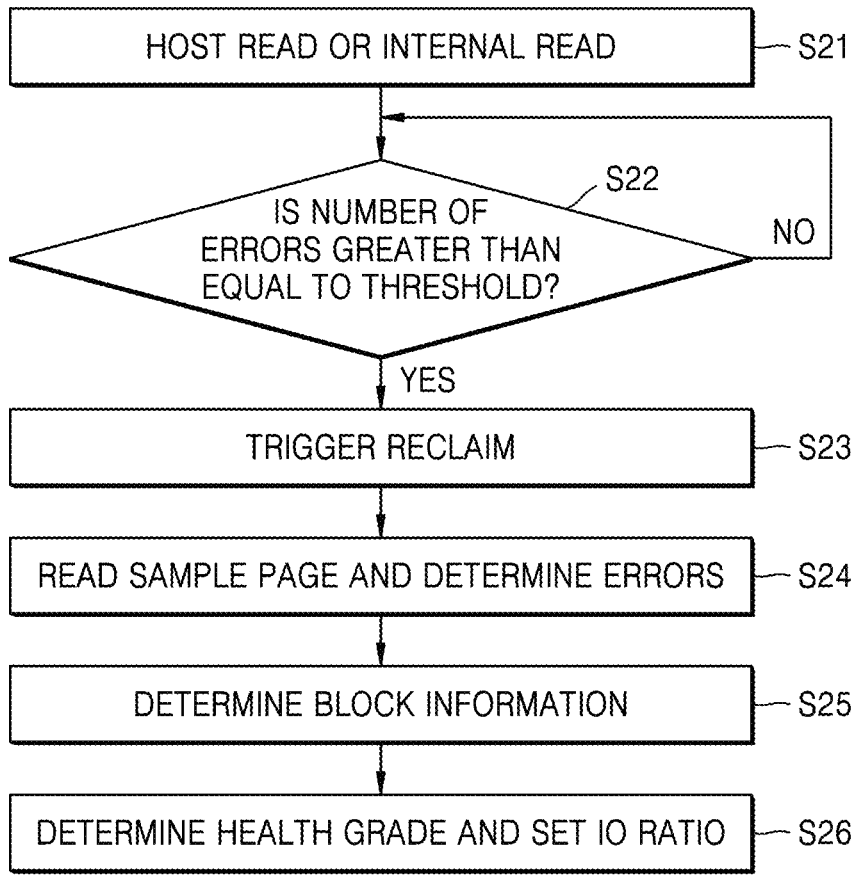
FIG. 12 is a flowchart illustrating an example operation method of a memory system.

FIG. 12 is a flowchart illustrating an operation method of a memory system, according to modifiable implementations. The implementation shown in FIG. 12 may include operations performed in a memory controller.

The memory controller may read one or more pages of a block in response to a request from a host, patrol read irrelevant to a request from the host, or RINC in operation S21 and determine in operation S22 whether the number of errors that occurred in the read data or an error ratio of the read data is greater than or equal to a certain threshold. If it is determined that the number of errors or the error ratio is greater than or equal to the certain threshold, reclaim on a corresponding block (hereinafter, referred to as a first block) may be triggered in operation S23.

The degradation state of the first block may be estimated according to the error detecting result described above, and in operation S24, one or more sample pages having relatively low reliability may be selected from among the plurality of pages of the first block and error detecting and determination may be performed on data read from the one or more sample pages. In addition, one or more pieces of block information related to the first block may be determined in operation S25, and in operation S26, the health grade of the first block may be determined based on a combination of the error detecting result and the one or more pieces of block information of the one or more sample pages and the IO ratio of the first block may be set.

According to the implementation described above, a reference for reclaim triggering and a reference for health grade determination may be related to error detecting results of different pages of the first block. For example, if the number of errors in a random page of the first block is greater than the certain threshold, reclaim on the first block is triggered, but a sample page of the first block may have lower reliability than the random page, and thus, the RR to UECC value of the first block may be more accurately determined by the error detecting result of the sample page. That is, by differently setting the reference for reclaim triggering and the reference for health grade determination, the speed of a reclaim operation on the first block before the occurrence of a UECC error may be optimally set.

Figure 13A:
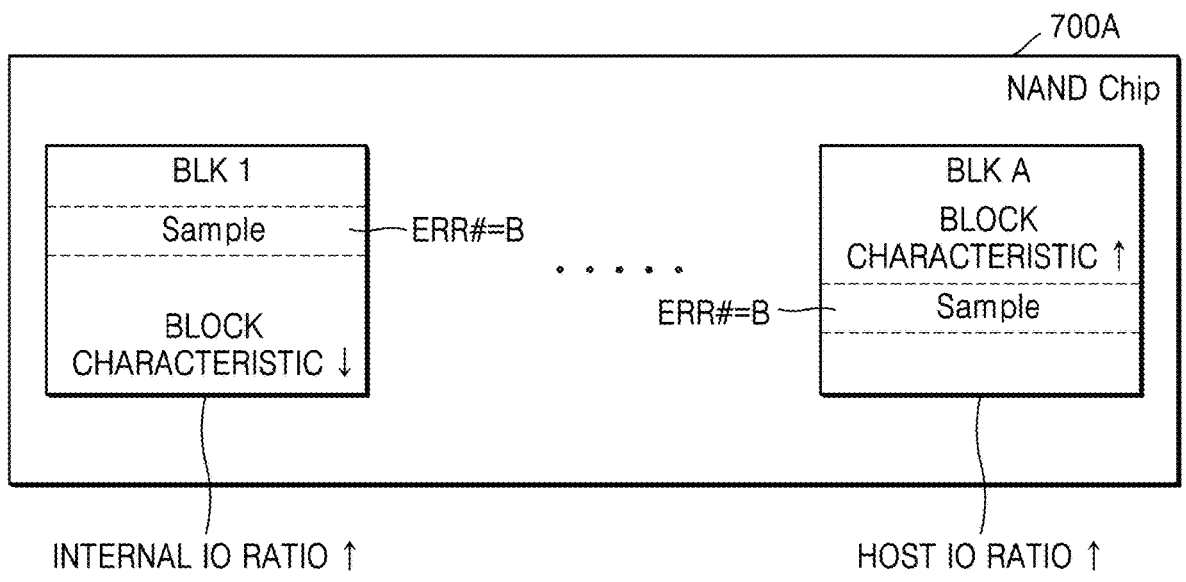
FIGS. 13A and 13B are block diagrams illustrating examples in which implementations are applied in various memory systems.
Figure 13B:
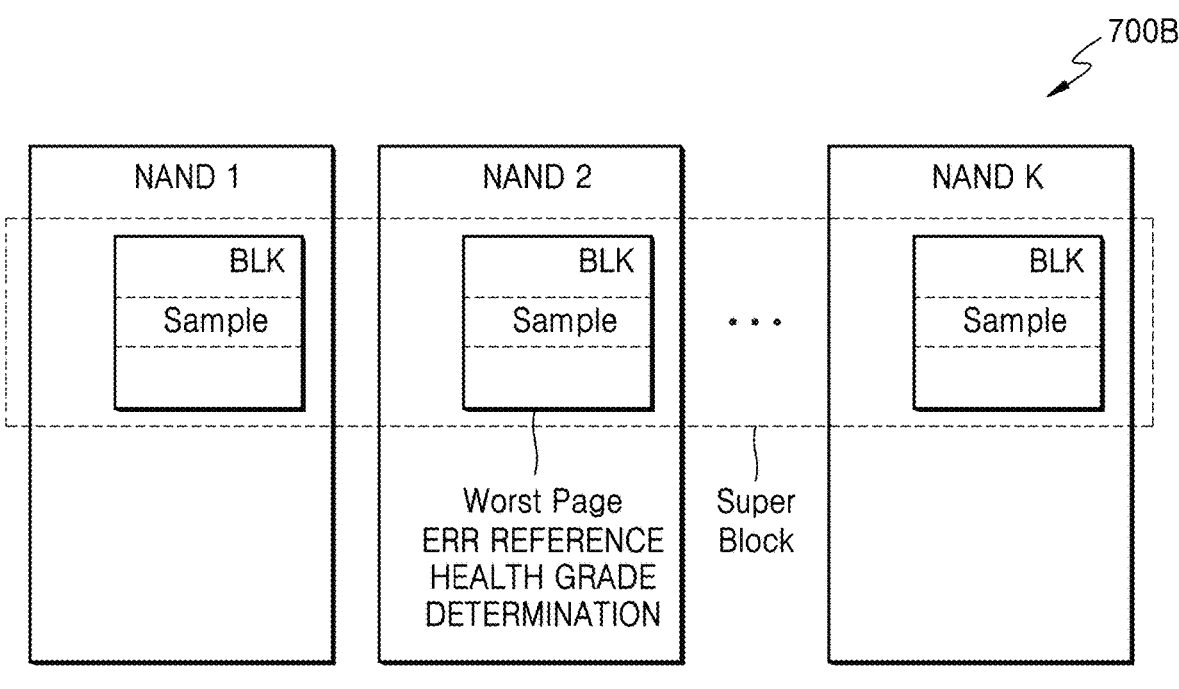

FIGS. 13A and 13B are block diagrams illustrating examples in which implementations are applied to various memory systems. FIG. 13A illustrates one NAND chip 700A, and FIG. 13B illustrates a case where a superblock is defined for a plurality of NAND chips, e.g., first to Kth NAND chips NAND 1 to NAND K and reclaim is performed in a superblock unit.

Referring to FIG. 13A, the NAND chip 700A may include a plurality of blocks, e.g., first to Ath blocks BLK 1 to BLK A, the number of errors that occurred in a sample page of the first block BLK 1 is B, and the number of errors that occurred in a sample page of the Ath block BLK A is also B. In addition, the sample pages of the first block BLK 1 and the Ath block BLK A may be at the same locations or different locations.

In addition, when reclaim is triggered on the first block BLK 1 and the Ath block BLK A, block information of each of the first block BLK 1 and the Ath block BLK A may be determined. In some implementations, block information may include a block address, and the reliability characteristic of a block may vary according to a location at which the block is formed in horizontal NAND or vertical NAND. According to a block address, if it is determined that the block characteristic of the first block BLK 1 is lower than the block characteristic of the Ath block BLK A, even though error detecting results of the sample pages of the first block BLK 1 and the Ath block BLK A are the same, the first block BLK 1 may have a higher internal IO ratio than the Ath block BLK A and the Ath block BLK A may have a higher host IO ratio than the first block BLK 1.

Referring to FIG. 13B, a memory device 700B may include the first to Kth NAND chips NAND 1 to NAND K, and blocks respectively included in the first to Kth NAND chips NAND 1 to NAND K may be defined as one superblock. As one implementation example, one block located at the same location in each of the first to Kth NAND chips NAND 1 to NAND K may be included in the superblock. In addition sample pages defined for the K blocks included in the superblock may be located at the same locations or different locations.

If reclaim is triggered according to an error detecting result of any one block included in the superblock, a reclaim operation on all the blocks included in the superblock may be performed at the same time. In this case, a health grade determination operation using an error detecting result of a sample page and block information may be performed on each of the blocks included in the superblock. In addition, an IO ratio may be set based on a block determined to have the lowest health grade, and the reclaim operation on all the blocks included in the superblock may be performed according to the set IO ratio.

Alternatively error detecting results may be generated from the sample pages of all the blocks included in the superblock, and a health grade determination operation using block information may be selectively performed on only a block having the worst error characteristic. An IO ratio may be set according to a health grade determined for the selected block, and the set IO ratio may be applied to all the blocks included in the superblock.

Alternatively each of the first to Kth NAND chips NAND 1 to NAND K may include, as block information, reliability information indicating the RI of a corresponding chip. In this case, the locations of all the blocks included in the super block may be the same in the first to Kth NAND chips NAND 1 to NAND K, respectively, and the degrees of degradation of the blocks may be substantially the same because write/erase and the like are performed at the same time. In addition, temperatures detected from the first to Kth NAND chips NAND 1 to NAND K included in the memory device 700B may be the same. In this case, factors influencing the health grades of all the blocks included in the superblock may include an error detecting result of a sample page of each of the K blocks included in the superblock and chip reliability information.

For example, a block which is a reference for setting an IO ratio among the K blocks included in the superblock may be selected according to a result obtained by calculating a health point according to an error detecting result and a health point according to a chip RI. In some implementations, the chip RI may have a fixed value, and a block which is the reference for setting an IO ratio may be determined according to the error detecting results of the K blocks included in the superblock. For example, even though the error characteristic of the sample page of the block in the first NAND chip NAND 1 is worse than the error characteristic of the sample page of the block in the Kth NAND chip NAND K, if the chip reliability of the Kth NAND chip NAND K is lower than the chip reliability of the first NAND chip NAND 1, the block in the Kth NAND chip NAND K may be the reference for setting an IO ratio. However, if the error characteristic of the sample page of the block in the first NAND chip NAND 1 is worse because the degree of degradation of the block in the first NAND chip NAND 1 increases more, a block which is the reference for setting an IO ratio may be changed from the block in the Kth NAND chip NAND K to the block in the first NAND chip NAND 1.

FIG. 14 illustrates a reclaim operation according to some implementations. FIG. 14 shows a reclaim queue included in a memory controller, wherein pieces of information (e.g., pieces of block address information) about a plurality of blocks on which reclaim has been triggered are stored in the reclaim queue, and reclaim operations on the plurality of blocks may be sequentially performed based on an order of the pieces of information stored in the reclaim queue.

When reclaim on ath to jth blocks Block_a to Block_j is triggered, pieces of block address information of the ath to jth blocks Block_a to Block_j may be stored in the reclaim queue. According to the current order of the pieces of block address information stored in the reclaim queue, reclaim may be performed in the order of the ath to jth blocks Block_a to Block_j.

The degrees of degradation of blocks about which pieces of information are stored in the reclaim queue may be determined in every certain period or aperiodically, and an order of the pieces of information stored in the reclaim queue may be changed according to a result of the determination. For example, the health grade determination in the implementations described above may be used for the order change, and as shown in FIG. 14, if it is determined that the health grades of the gth, hth, ith, and jth blocks Block_g, Block_h, Block_i, and Block_j are relatively low, the storage locations of the pieces of block address information of the ath to jth blocks Block_a to Block_j may be changed so that reclaim on the gth, hth, ith, and jth blocks Block_g, Block_h, Block_i, and Block_j has an earlier order than the other blocks in the reclaim queue. In addition, if it is determined that the health grades of the ath, bth, and cth blocks Block_a, Block_b, and Block_c are relatively high, the storage locations of the pieces of block address information of the ath to jth blocks Block_a to Block_j may be changed so that reclaim on the ath, bth, and cth blocks Block_a, Block_b, and Block_c has a later order than the other blocks in the reclaim queue. That is, reclaim operations on the gth, hth, ith, and jth blocks Block_g, Block_h, Block_i, and Block_j may be first performed, and reclaim operations on the ath, bth, and cth blocks Block_a, Block_b, and Block_c may be performed last.

In addition, when reclaim is performed on a block about which information is stored in the reclaim queue, the health grade determination according to the implementations described above may be performed again at the timing of performing the reclaim. For example, when reclaim on the gth block Block_g is performed, the health grade of the gth block Block_g may be determined, and an IO ratio may be set according to a result of the determination. Accordingly, different IO ratios may be set for the ath to jth blocks Block_a to Block_j, and reclaim on the ath to jth blocks Block_a to Block_j may be performed at different speeds.

In some implementations, a change in a reclaim order of blocks may be performed in other various methods. For example, in relation to a change in a reclaim order, an error detecting result of a sample page of each of the ath to jth blocks Block_a to Block_j may be used. According to the error detecting result of the sample page, a reclaim order may be changed so that a block having a higher BER is first reclaimed. Alternatively, if a plurality of blocks stored in the reclaim queue are blocks included in a plurality of NAND chips, the change in a reclaim order may be performed based on a combination of error detecting results of sample pages and the RIs of the plurality of NAND chips.

Figure 15:
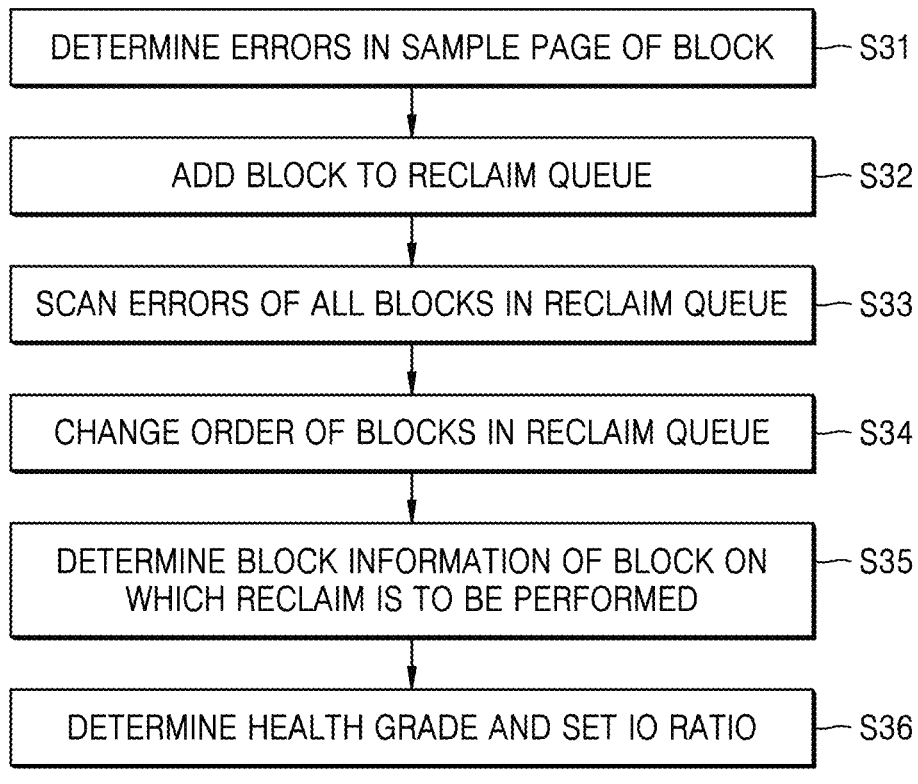
FIG. 15 is a flowchart illustrating an operation method of a memory system, according to the example implementation shown in FIG. 14.

FIG. 15 is a flowchart illustrating an operation method of a memory system, according to the implementation shown in FIG. 14.

Referring to FIG. 15, data of a random page in a block may be read based on a request from a host or internal reading, and whether reclaim on the block is triggered may be determined based on an error detecting result of the random page. For example, whether reclaim is triggered may be determined according to whether a sample page in a block is erroneous is determined in operation S31. In addition, if reclaim is triggered, block address information of the block may be included in a reclaim queue in operation S32.

Pieces of block address information of a plurality of blocks may be stored in the reclaim queue, and errors of all the blocks in the reclaim queue may be scanned periodically or aperiodically in operation S33. The error scan may include an operation of reading sample pages of all the blocks in the reclaim queue and detecting errors of data read from the sample pages. In addition, the pieces of block address information stored in the reclaim queue may be changed to change a reclaim order of the plurality of blocks, based on error detecting results of the sample pages in operation S34.

After changing the pieces of block address information stored in the reclaim queue, reclaim on a block may be performed in a newly set order, and block information of the block on which reclaim is to be performed may be determined in operation S35. In addition, in some implementations, errors of a sample page of the block on which reclaim is to be performed may be detected again. According to the implementations described above, in operation S36, the health grade of the block may be determined based on a combination of an error detecting result and/or the block information and an IO ratio corresponding to the determined health grade may be set.

According to some implementations above, pieces of information to be used for reclaim triggering, an information change for changing an order in the reclaim queue, and IO ratio setting may be variously set. That is without being limited to the method shown in FIG. 15, the reclaim triggering, the order change in the reclaim queue, the IO ratio setting, and the like may be determined based on various combinations of an error detecting result of a random page, an error detecting result of a sample page, and block information.

Figure 16:
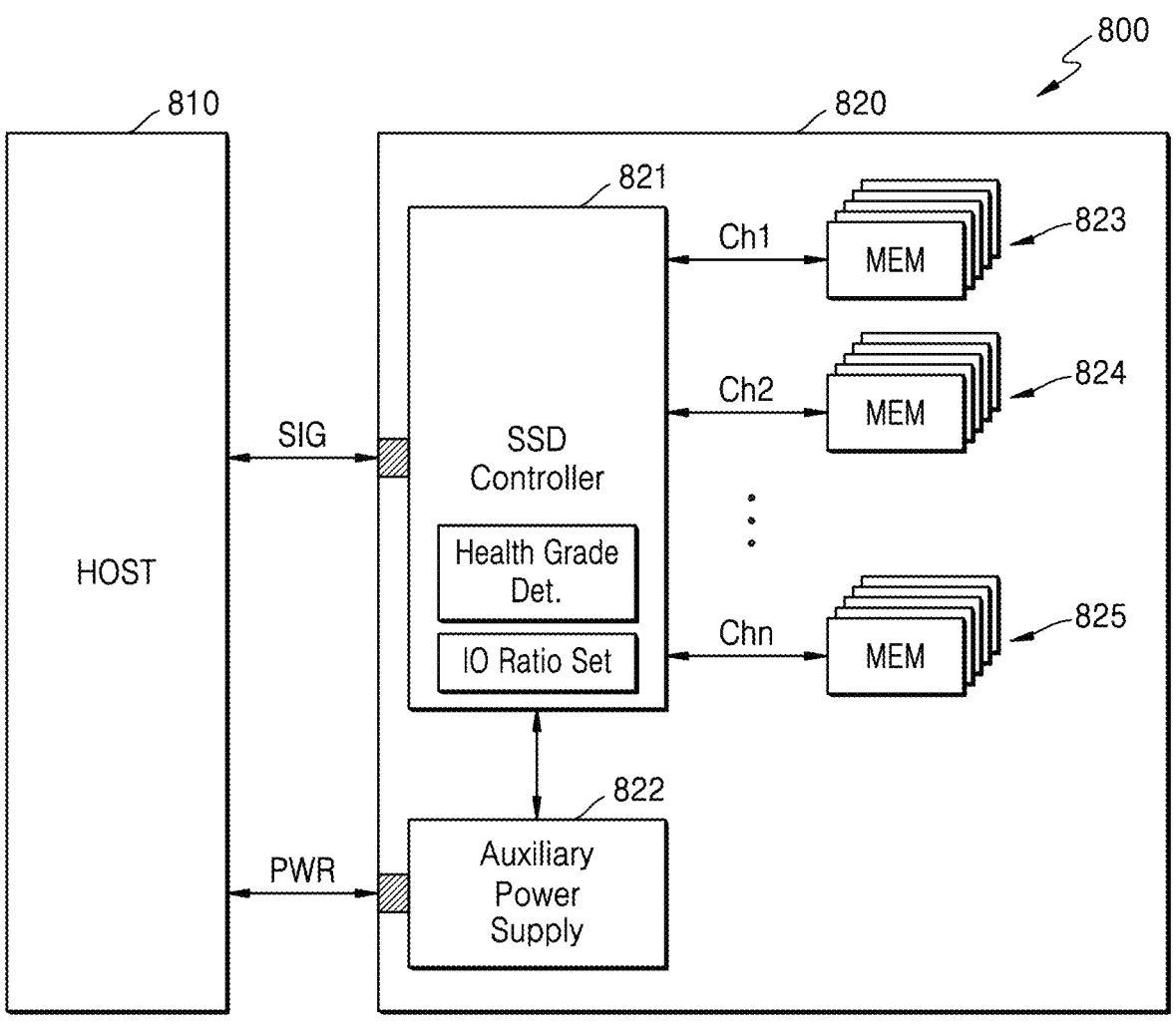
FIG. 16 is a block diagram illustrating an example in which a memory device is applied to a solid state drive (SSD) system.

FIG. 16 is a block diagram illustrating an example in which a memory device is applied to an SSD system 800.

Referring to FIG. 16, the SSD system 800 may include a host 810 and an SSD 820. The SSD 820 exchanges signals with the host 810 through a signal connector and receives power through a power connector. The SSD 820 may include an SSD controller 821, an auxiliary power supply 822, and memory devices 823 to 825. The memory devices 823 to 825 may be vertical-stacked NAND flash memory devices. Herein, the SSD 820 may be implemented using the implementations described above with reference to FIGS. 1 to 15. That is, the SSD controller 821 may perform a host IO and an internal IO with the memory devices 823 to 825 and set an IO ratio according to the implementations described above to control a background operation on the memory devices 823 to 825. Accordingly, the SSD controller 821 may include a health grade determining circuit and an IO ratio setting circuit, and determine a health grade and set an IO ratio in a NAND chip unit included in the memory devices 823 to 825 or in a block unit for a plurality of blocks included in a NAND chip.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

While the inventive concept has been particularly shown and described with reference to embodiments thereof, it will be understood that various changes in form and details may be made therein without departing from the spirit and scope of the following claims.

What is claimed is:

1. A memory controller that communicates with a memory device comprising a plurality of blocks, the memory controller comprising:

a health grade determining circuit configured to determine a health grade of a first block among the plurality of blocks based on a combination of an error detecting result of data read from a first page of the first block and block information related to a determination of a degree of degradation of the first block; and an input/output (IO) ratio setting circuit configured to set, according to the determined health grade, an IO ratio between a host IO operation that exchanges data with the memory device in response to a request from a host and an internal IO operation that exchanges data with the memory device in relation to a background operation on the memory device, wherein the memory controller performs the host IO operation and the internal IO operation with the memory device according to the set IO ratio during a period in which the background operation on the first block is performed, and wherein, based on the health grade of the first block being different from a health grade of a second block among the plurality of blocks, the IO ratio of the first block is set differently from an IO ratio of the second block and a frequency of performing the host IO operation for the first block is different from a frequency of performing the host IO operation for the second block.

2. The memory controller of claim 1, wherein the block information comprises at least one of a block address of the first block, a write/erase cycle count of the first block, temperature information generated from the memory controller or the memory device, and a reliability index (RI) of the first block.

3. The memory controller of claim 2, wherein the block information comprises manufacturing process information, and the memory controller further comprises a storing circuit configured to store, in a nonvolatile manner, the manufacturing process information, wherein at least one piece of the manufacturing process information stored in the storing circuit is provided to the health grade determining circuit.

4. The memory controller of claim 1, wherein the first block comprises a plurality of pages, the first page comprises a sample page having a reliability index below a threshold reliability among the plurality of pages, and the health grade determining circuit is configured to determine the health grade of the first block based on a combination of an error detecting result of the sample page and the block information of the first block.

5. The memory controller of claim 4, wherein, based on errors greater than a certain reference value being detected from data read from a second page of the first block based on a request from the host or an internal read operation, triggering a background operation on the first block, and after the background operation is triggered, the health grade determining circuit is configured to determine the health grade of the first block.

6. The memory controller of claim 5, wherein the second page includes a page at a different location in the first block from the sample page.

7. The memory controller of claim 4, wherein, based on locations of sample pages set for the plurality of blocks differing from each other, the health grade determining circuit is configured to determine health grades of the plurality of blocks by using error detecting results of the sample pages at different locations in the plurality of blocks.

8. The memory controller of claim 1, wherein pieces of block address information of first to Nth blocks, on which a background operation has been triggered, among the plurality of blocks, are stored in a queue, and the background operation on the first to Nth blocks is sequentially performed according to an order of the pieces of block address information stored in the queue, and wherein N is an integer of 2 or greater.

9. The memory controller of claim 8, wherein each of the first to Nth blocks comprises the first page, the first page corresponds to a sample page having relatively low reliability among a plurality of pages included in each of the first to Nth blocks, and the order of the background operation on the first to Nth blocks is changed based on error detecting results of the sample pages of the first to Nth blocks.

10. An operation method of a memory controller that communicates with a memory device comprising a plurality of blocks, the method comprising:

triggering a background operation on a first block among the plurality of blocks according to an error detecting result of data read from at least one first page of the first block;

setting an input/output (IO) ratio between a host IO operation that exchanges data with the memory device in response to a request from a host and an internal IO operation that exchanges data with the memory device in relation to a background operation on the memory device, as a first value according to a health grade of the first block, wherein the health grade of the first block is determined based on block information related to a determination of a degree of degradation of the first block and an error detecting result of data read from at least one second page of the first block, and wherein based on the health grade of the first block being different from a health grade of a second block among the plurality of blocks, the IO ratio of the first block is set differently from an IO ratio of the second block and a frequency of performing the host IO operation for the first block is different from a frequency of performing the host IO operation for the second block; and performing the host IO operation and the internal IO operation with the memory device according to the IO ratio set as the first value, during a period in which the background operation on the first block is performed.

11. The method of claim 10, wherein a ratio of the internal IO is decreased when the health grade indicates that the degree of degradation of the first block is low, and the ratio of the internal IO is increased when the health grade indicates that the degree of degradation of the first block is high.

12. The method of claim 10, further comprising:

triggering a background operation on a second block among the plurality of blocks; and setting the IO ratio of the second block as a second value based on a health grade determined for the second block, based on a degree of degradation of the second block being higher than the degree of degradation of the first block, wherein a speed of the background operation on the second block is faster than a speed of the background operation on the first block.

13. The method of claim 10, wherein the at least one first page is selected by a request from the host or an internal read operation of the memory device, and the at least one second page is at least one sample page having a reliability index below a certain threshold among a plurality of pages included in the first block.

14. The method of claim 10, wherein the background operation comprises a reclaim operation of copying data in any one source block to any one destination block and a garbage collection operation of selectively copying valid data in a plurality of source blocks to at least one destination block.

15. The method of claim 10, wherein the block information comprises at least one of a block address of the first block, a write/erase cycle count of the first block, temperature information generated from the memory controller or the memory device, and a reliability index (RI) of the first block.

16. The method of claim 10, wherein pieces of block address information of first to Nth blocks, on which a background operation has been triggered among the plurality of blocks, are stored in a queue, and the at least one second page corresponds to a sample page having a reliability index below a certain threshold among a plurality of pages included in each of the first to Nth blocks, wherein N is an integer of 2 or greater, and further comprising:

detecting errors in the at least one second page in each of the first to Nth blocks; and changing an order of the background operation on the first to Nth blocks based on an error detecting result of the at least one second page.

17. A storage device comprising:

a nonvolatile memory device comprising a plurality of blocks; and a memory controller configured to perform a host input/output (IO) operation that exchanges data with the nonvolatile memory device in response to a request from a host and an internal IO operation that exchanges data with the nonvolatile memory device in relation to a background operation on the nonvolatile memory device, wherein the memory controller is further configured to set, as a first value, a performing ratio of the internal IO operation to the host IO operation with respect to a first block among the plurality of blocks based on block information related to determination of a degree of degradation of the first block and a first error detecting result, and set, as a second value, a performing ratio of the internal IO operation to the host IO operation with respect to a second block among the plurality of blocks based on block information related to determination of a degree of degradation of the second block and a second error detecting result, and based on the first value being greater than the second value, a speed of a background operation on the first block is faster than a speed of a background operation on the second block.

18. The storage device of claim 17, wherein the block information comprises at least one of a block address indicating a location of a block, a write/erase cycle count of each of the first and second blocks, temperature information generated from the memory controller or the memory device, and a reliability index (RI) of each of the first and second blocks.

19. The storage device of claim 18, wherein at least one sample page having a reliability index below a certain threshold among a plurality of pages is defined for each of the first block and the second block, the first value is set based on the block information of the first block and the first error detecting result of the at least one sample page of the first block, and the second value is set based on the block information of the second block and the second error detecting result of the at least one sample page of the second block.

20. The memory controller of claim 1, wherein the health grade is based on health points associated with each of the block information and the error detecting result.

\* \* \* \* \*